(12) United States Patent
Chevalier et al.

(10) Patent No.: US 7,557,524 B2
(45) Date of Patent: Jul. 7, 2009

(54) LIGHTING DEVICE

(75) Inventors: Daniel Chevalier, Boisbriand (CA); Alain Martel, Sainte-Adèle (CA)

(73) Assignee: Gestion Proche Inc., Bois-des-Filion (CA)

( * ) Notice: Subject to any disclaimer, the term of this patent is extended or adjusted under 35 U.S.C. 154(b) by 0 days.

(21) Appl. No.: 11/590,759

(22) Filed: Nov. 1, 2006

(65) Prior Publication Data
US 2007/0211463 A1 Sep. 13, 2007

Related U.S. Application Data

(63) Continuation of application No. 11/038,069, filed on Jan. 21, 2005, now abandoned, which is a continuation of application No. 10/021,556, filed on Dec. 19, 2001, now abandoned.

(30) Foreign Application Priority Data

Dec. 20, 2000 (CA) ................................... 2329305
Feb. 14, 2001 (CA) ................................... 2336497

(51) Int. Cl.
*H05B 37/00* (2006.01)
(52) U.S. Cl. .................. 315/318; 315/360; 315/312; 315/294; 315/291; 315/149; 250/214 AL
(58) Field of Classification Search ................ 315/312, 315/360, 362, 291, 307, 224, 149, 77, 82, 315/294, 318; 340/458; 250/214 AL, 553; 307/10.8
See application file for complete search history.

(56) References Cited

U.S. PATENT DOCUMENTS

| 4,271,408 A | 6/1981 | Teshima et al. |
| 4,298,869 A | 11/1981 | Okuno |
| 4,357,671 A | 11/1982 | Miller |
| 5,134,387 A | 7/1992 | Smith et al. |
| 5,184,114 A | 2/1993 | Brown |
| 5,382,782 A | 1/1995 | Hasegawa et al. |
| 5,420,482 A | 5/1995 | Phares |
| 5,514,698 A | 5/1996 | Ahmad et al. |
| 5,661,645 A * | 8/1997 | Hochstein ................ 363/89 |
| 5,783,909 A | 7/1998 | Hochstein |
| 5,803,579 A | 9/1998 | Turnbull et al. |
| 5,914,698 A | 6/1999 | Nicholson et al. |
| 5,952,917 A * | 9/1999 | Zimmermann et al. ...... 340/469 |
| 6,078,148 A * | 6/2000 | Hochstein ................. 315/291 |
| 6,127,783 A | 10/2000 | Pashley et al. |
| 6,147,617 A | 11/2000 | Kim |
| 6,150,771 A | 11/2000 | Perry |
| 6,150,774 A | 11/2000 | Mueller et al. |
| 6,150,996 A | 11/2000 | Nicholson et al. |
| 6,153,985 A | 11/2000 | Grossman |

(Continued)

FOREIGN PATENT DOCUMENTS

DE 42 24 435 A 1/1994

(Continued)

*Primary Examiner*—Haissa Philogene

(57) ABSTRACT

An LED lighting device is provided which is capable of being connected to a network and being controlled by a host computer also connected to the network. The lighting device has several lifespan expanding features such as including several extra LEDs such that as the LEDs of the lighting device degrade over time more LEDs can be turned on thus allowing a constant luminosity to be maintained.

29 Claims, 18 Drawing Sheets

U.S. PATENT DOCUMENTS

| | | |
|---|---|---|
| 6,166,496 A | 12/2000 | Lys et al. |
| 6,175,342 B1 | 1/2001 | Nicholson et al. |
| 6,211,626 B1 | 4/2001 | Lys et al. |
| 6,236,331 B1 | 5/2001 | Dusserault |
| 6,255,786 B1 | 7/2001 | Yen |
| 6,585,395 B2 | 7/2003 | Luk |
| 6,630,801 B2 | 10/2003 | Schuurmans |
| 6,690,268 B2 | 2/2004 | Schofield et al. |
| 6,870,325 B2 | 3/2005 | Bushell et al. |

FOREIGN PATENT DOCUMENTS

| | | |
|---|---|---|
| DE | 200 02 482 U | 4/2000 |
| EP | 0 249 031 A | 12/1987 |
| EP | 0 966 183 A | 12/1999 |
| WO | WO-98 52182 A | 11/1998 |

* cited by examiner

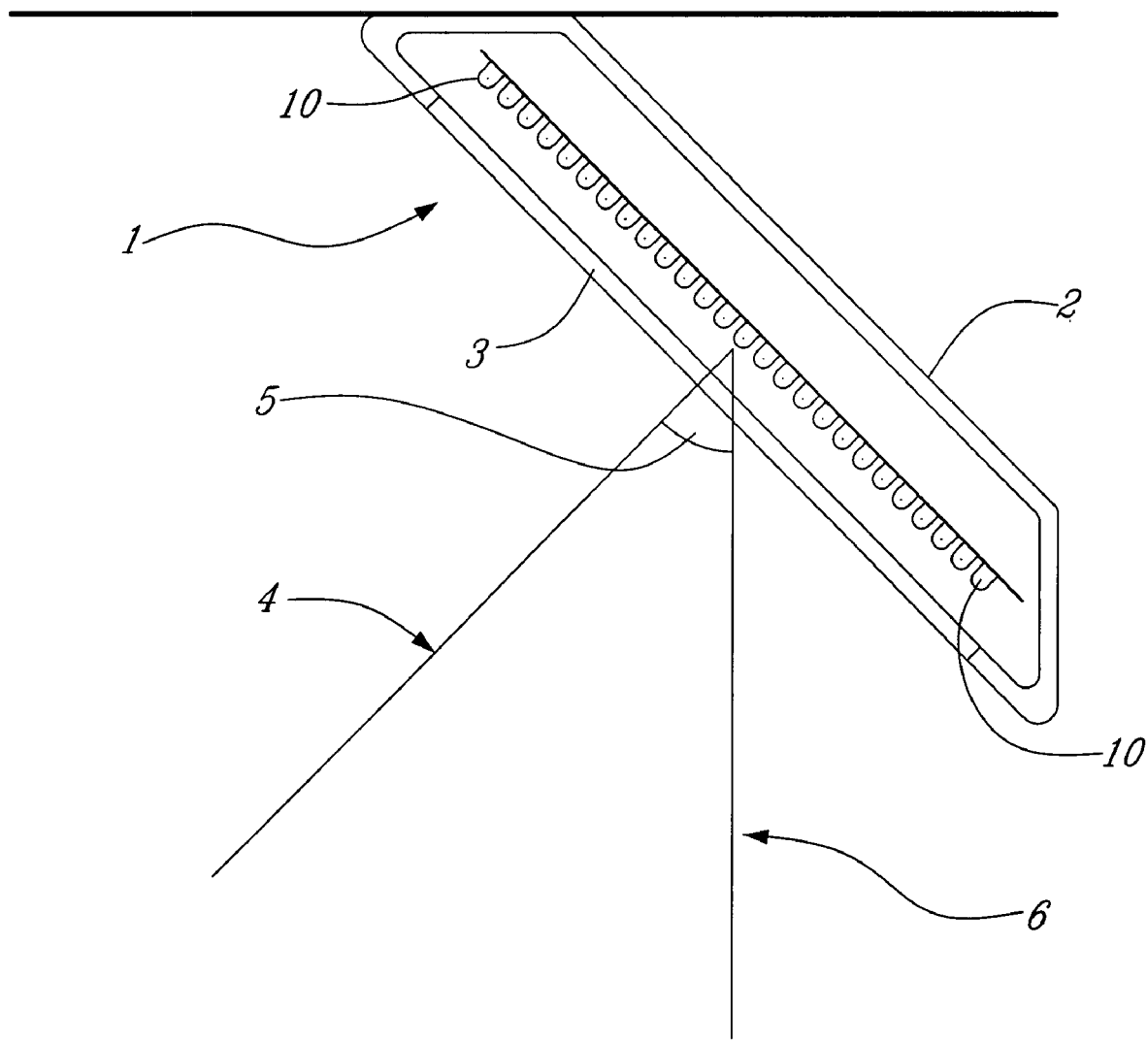
FIG_1

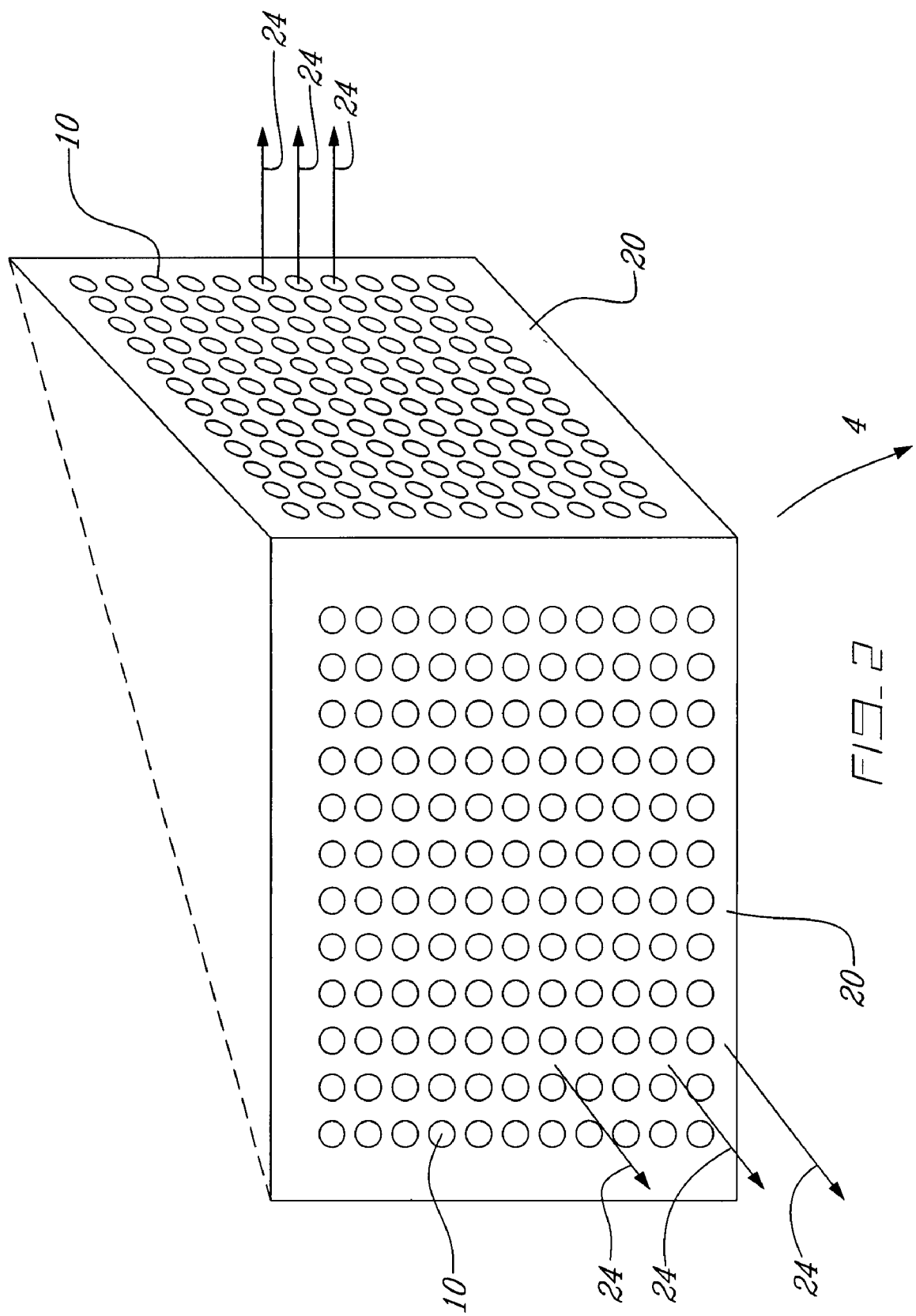

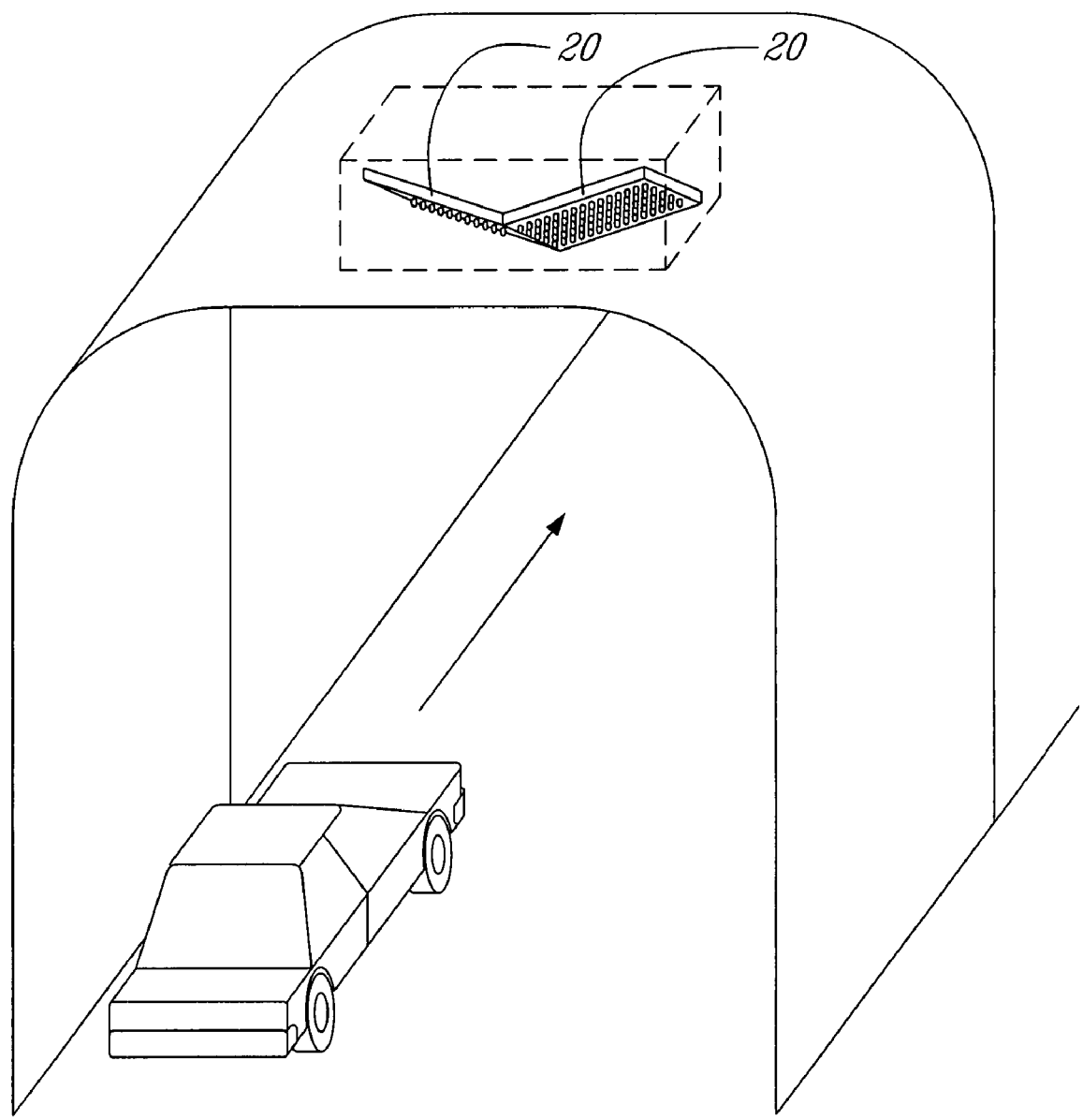
FIG_2A

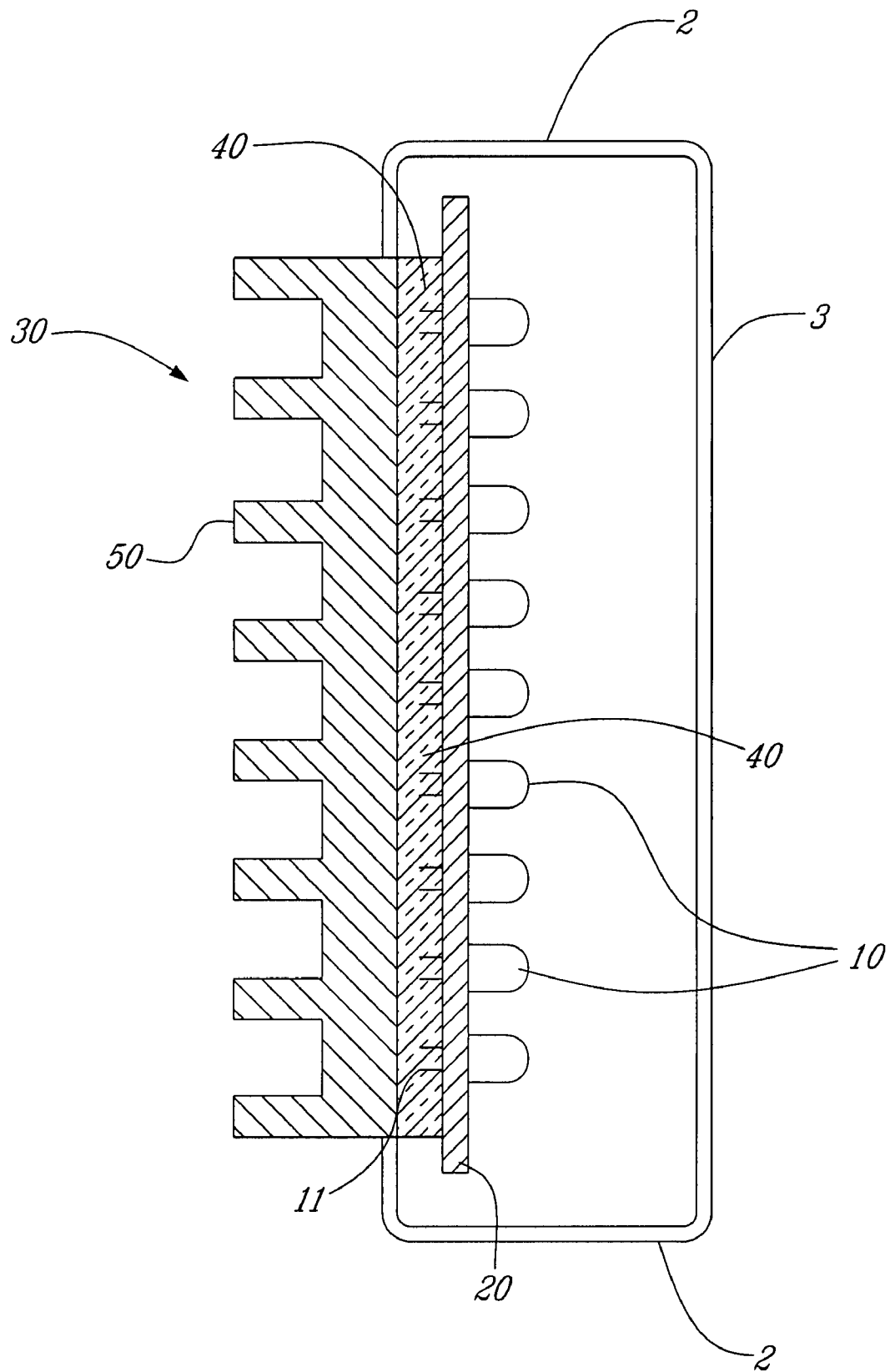
FIG_3

FIG_5

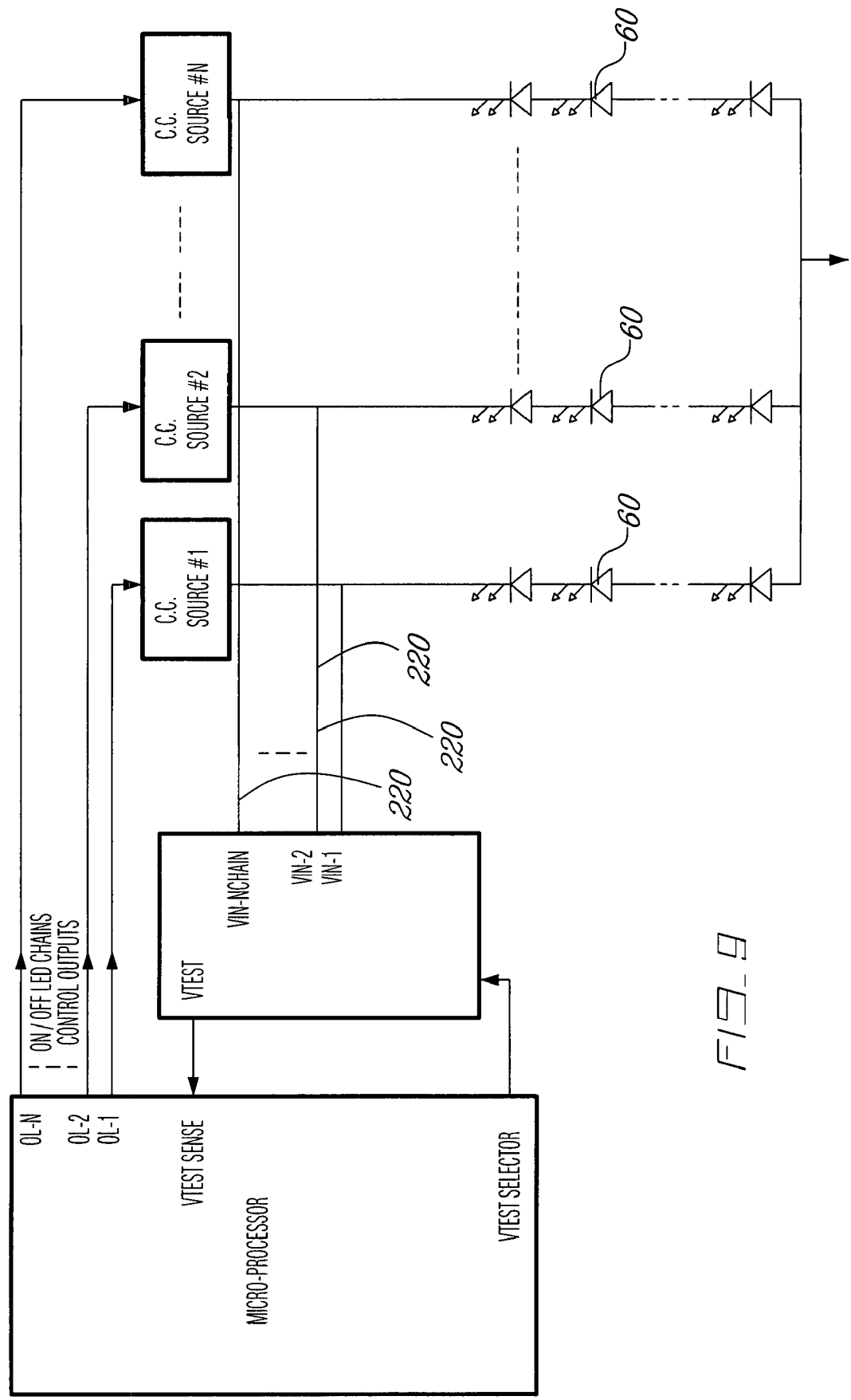
FIG_9

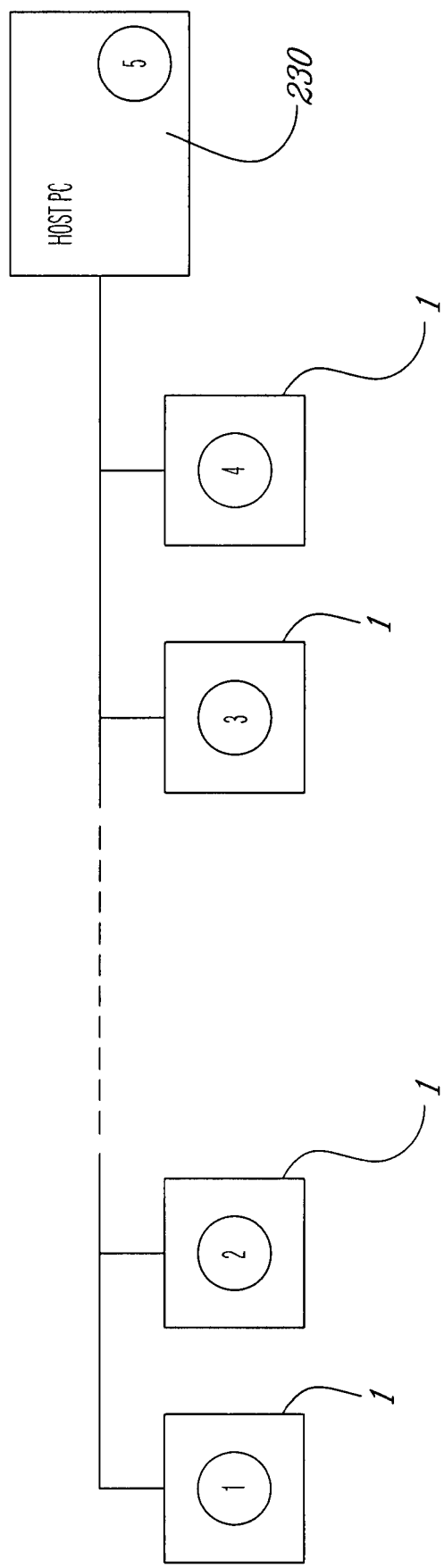

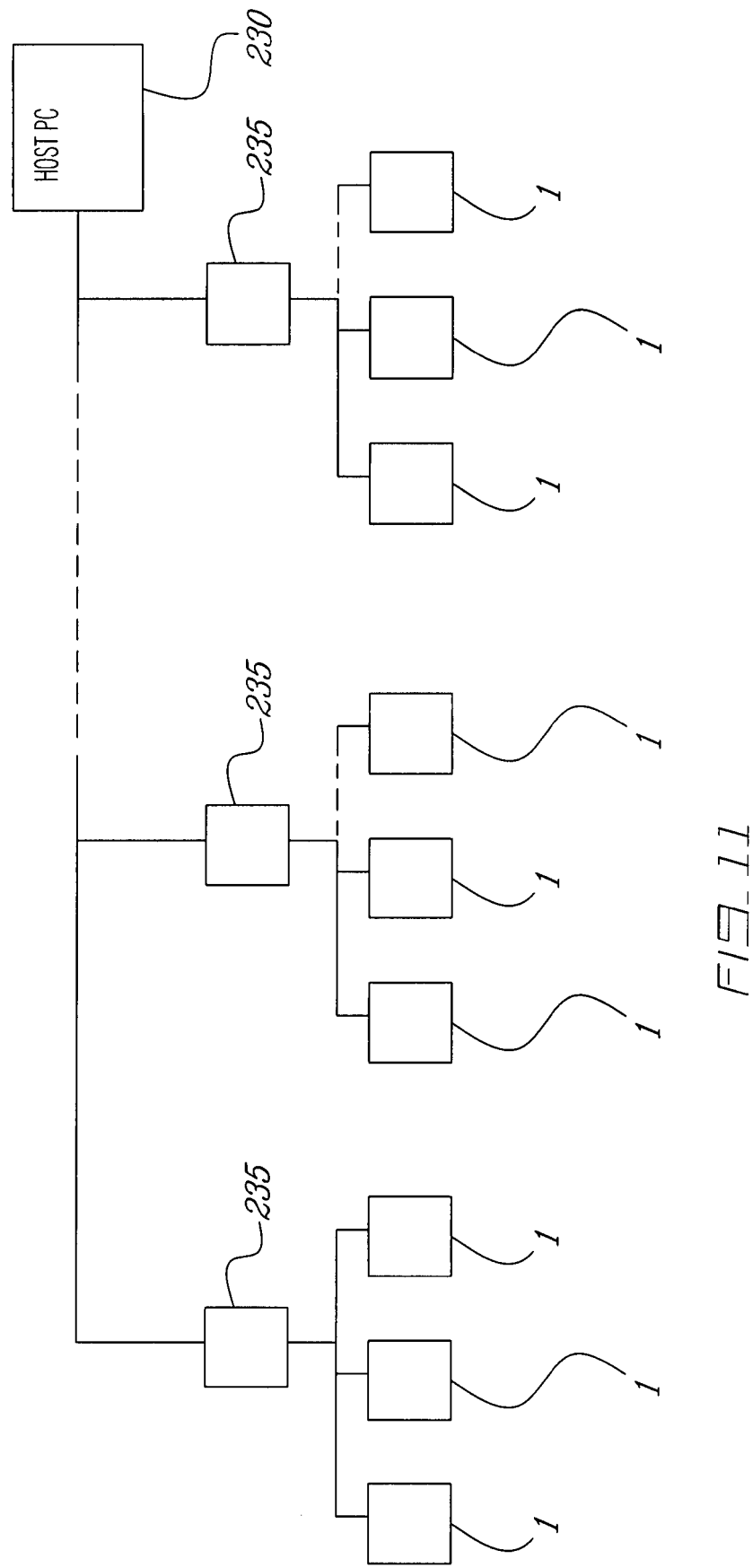

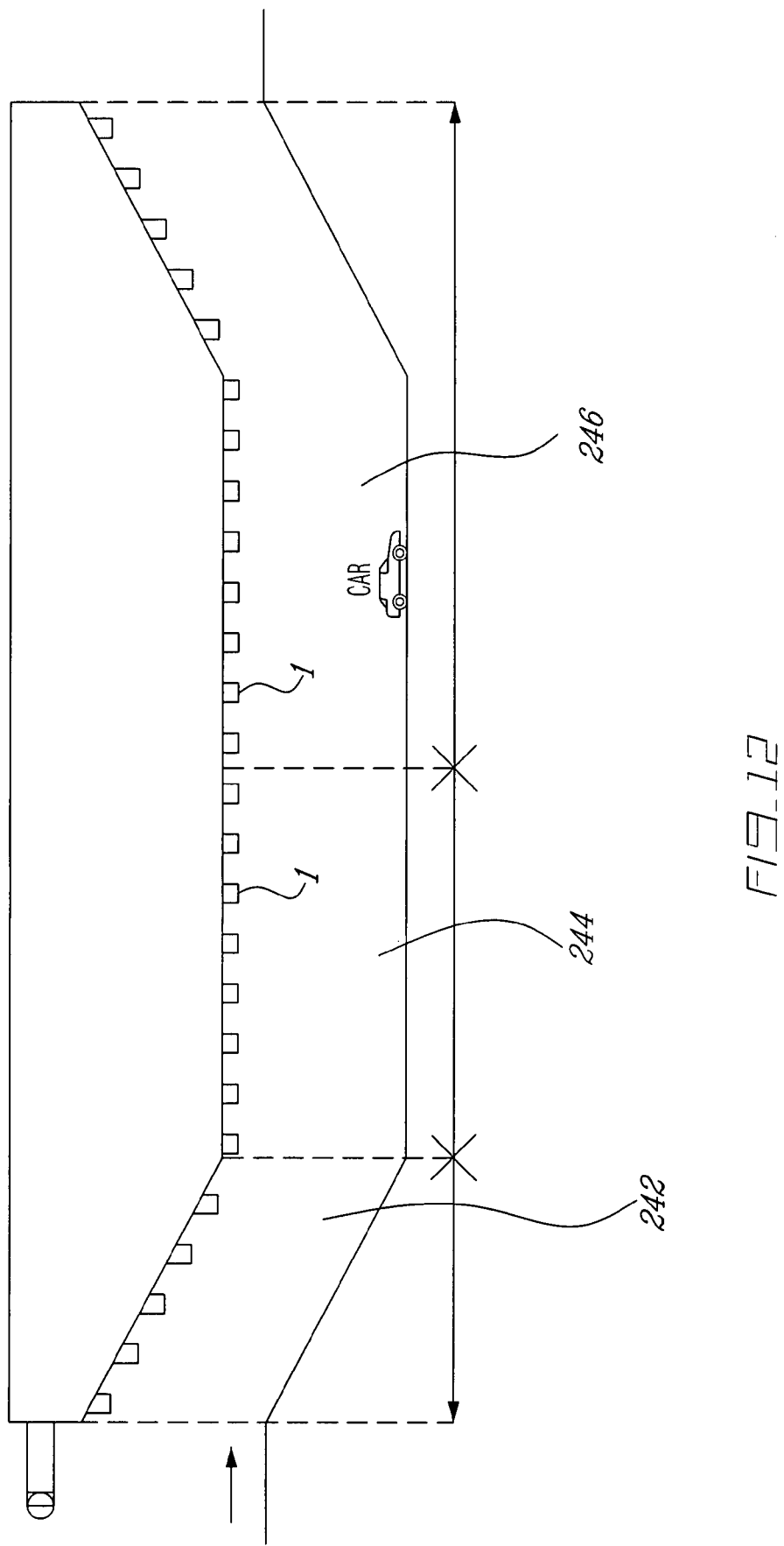

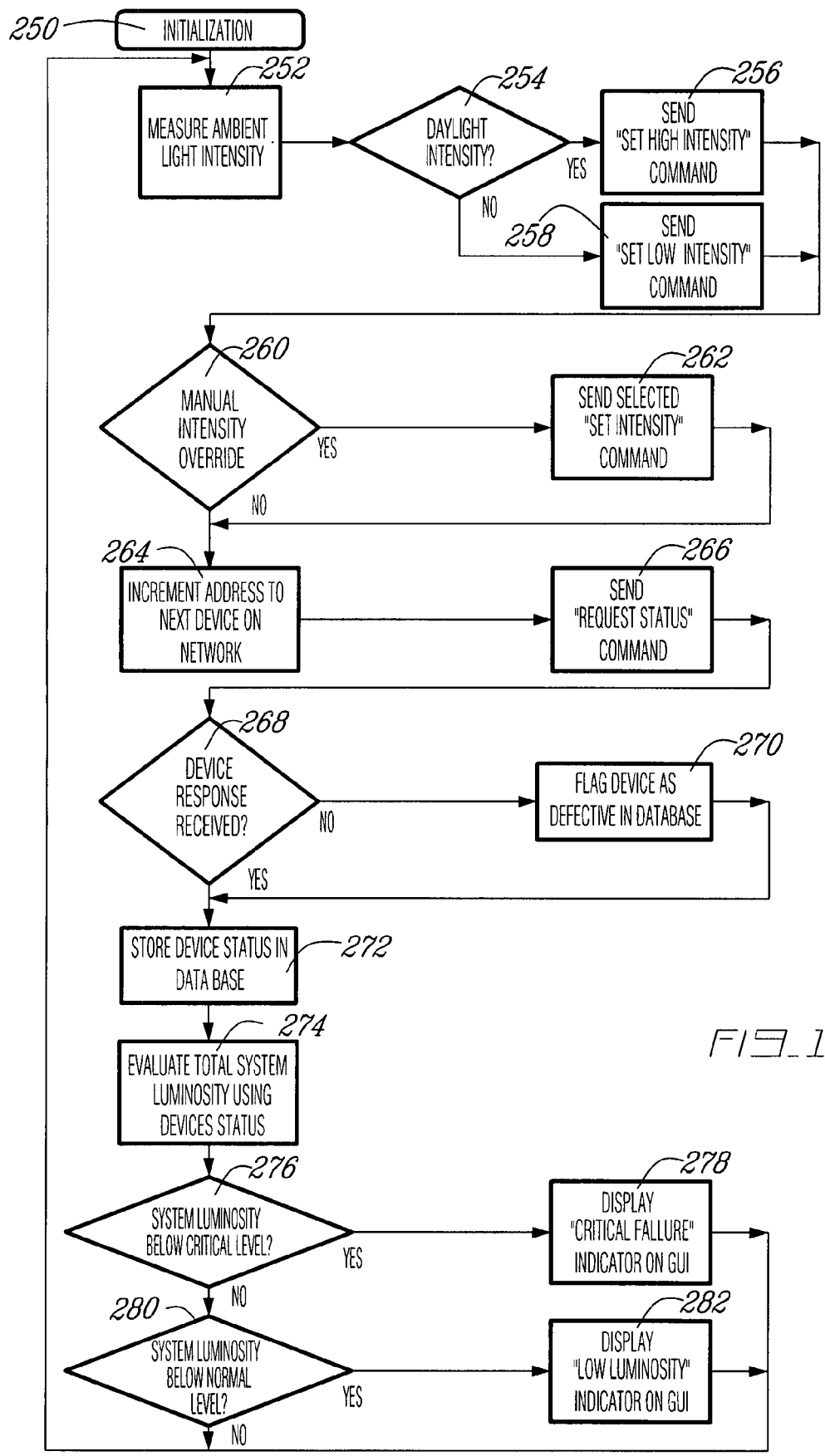
FIG_13

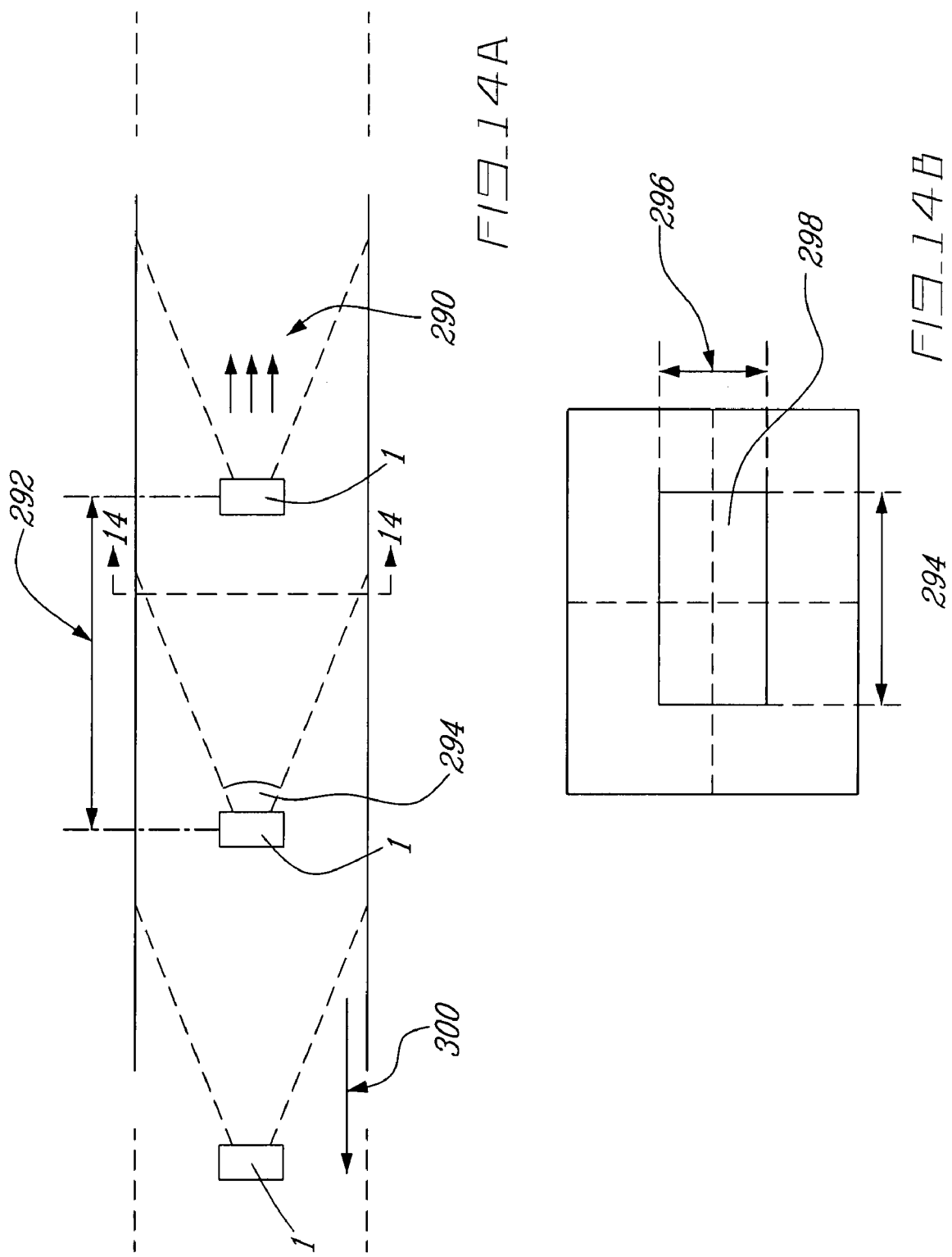

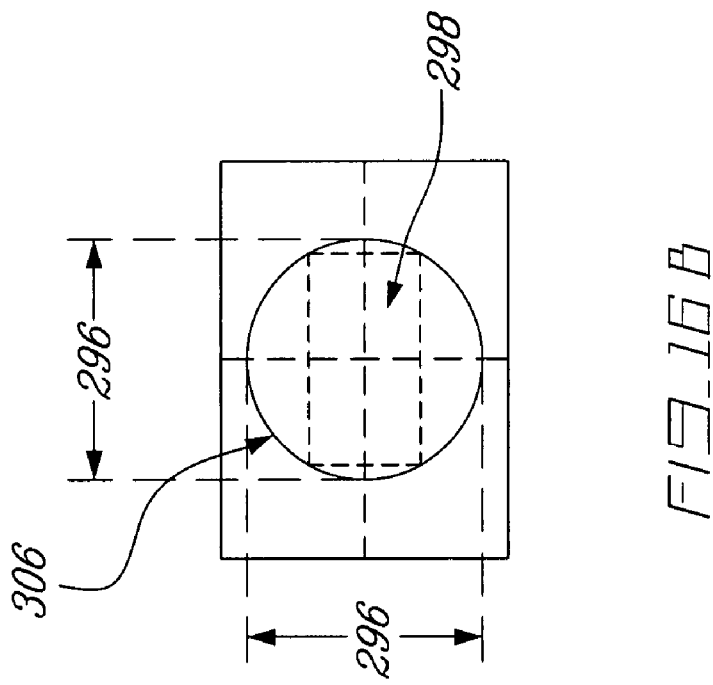
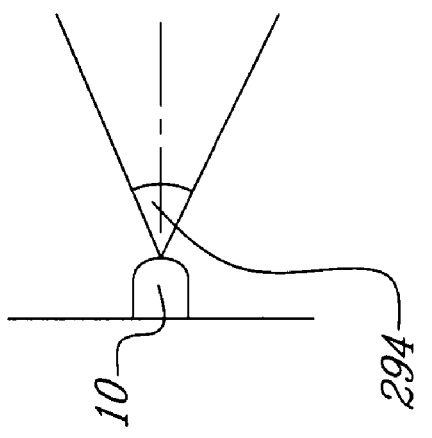
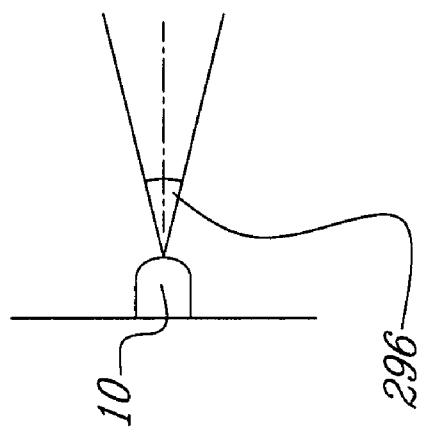

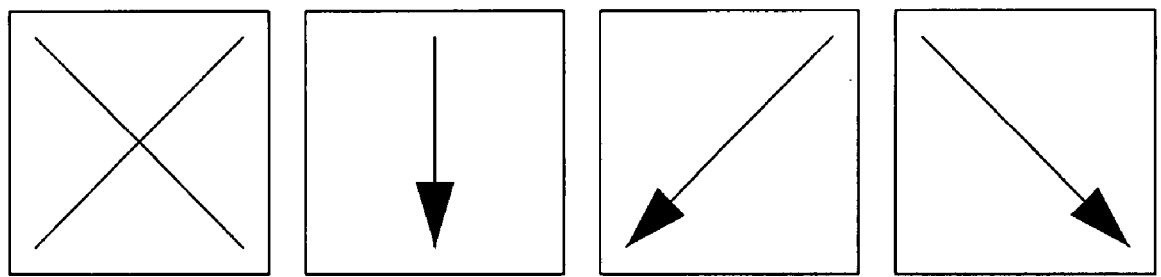
FIG_18

LIGHTING DEVICE

The present is a continuation of U.S. application Ser. No. 11/038,069 filed Jan. 21, 2005 now abandoned which is a continuation of U.S. patent application Ser. No. 10/021,556 filed on Dec. 19, 2001 now abandoned.

BACKGROUND OF THE INVENTION

The current invention is an light emitting diode (herein referred to as LED) lighting device having multiple features designed to allow the lighting device to maintain luminosity as measured in candelas, over its lifespan. The invention is also designed so that multiple lighting devices can be connected in a network controlled by a host computer, such that the general luminosity over an area (e.g. a tunnel) can be controlled.

Traditionally, roads and tunnel lighting devices have used uses HID (High-intensity Discharge) lamps, powered with high-voltage (e.g. 300VAC to 400VAC).

Existing roadway standards divide the length of the tunnel into a number of regions. Each region requires a lighting intensity (sometimes herein referred to as luminosity) that increases as it is nearer the entrance/exit points (because of the presence of higher illumination from the sun), and decreases towards the middle of the tunnel. As an example, a typical system can use one 130 W lamp per 1.75 m per road lane in order to satisfy the daytime specifications required in the Interior Zone of a tunnel.

A problem with current tunnel lighting lamps is with lifespan. In a typical tunnel lamp which uses one or maybe two illumination sources, the lighting device can easily become unusable should the illumination source break down. In these cases the illumination sources need to be replaced manually before the lighting device can again provide sufficient light. It also is necessary to close lanes in the tunnel while the maintenance is in progress. Thus maintenance of lighting devices can become costly and time consuming.

Therefore, a new lighting device which allows for a longer lifespan without maintenance is desired. The present invention attempts to provide such a lighting device using LEDs as illumination sources. While an individual LEDs is on its own not sufficient to provide lighting for a tunnel, LEDs only cost a fraction of what a typical HID lamp would cost. An LED further uses much less power than that of a typical HID lamp. Therefore, a plurality of LEDs can be provided for a lighting device and the cost and power usage would still be below that of a typical HID lamp. For instance a example LED lighting device could provide lighting for the interior of a tunnel, while using 780 LEDs and being powered by a 24VDC power supply LED lighting devices are known in the art, though most of these lighting devices are use for making billboards and traffic signals. Examples these kinds of lighting devices can be found in U.S. Pat. No. 6,175,342 Nicholson et al., U.S. Pat. No. 6,150,771 Perry, U.S. Pat. No. 6,150,996 Nicholson et al., U.S. Pat. No. 5,514,698 Nicholson et al., U.S. Pat. No. 4,357,671 Miller, U.S. Pat. No. 4,271,408 Teshima et al., and U.S. Pat. No. 4,298,869 Okuno.

Using a plurality of LEDs as a replacement for an standard illumination source is less common, but are for instance described in U.S. Pat. No. 6,255,786 Yen, and U.S. Pat. No. 6,211,626 Lys et al. These lighting devices show that LEDs can be used to replace more standard illumination sources. They do, however, not have features which allow for a constant luminosity to be maintained over an extended lifespan.

Certain patents, such as U.S. Pat. No. 6,236,331 B1 Dussureallt, U.S. Pat. No. 6,153,985 Grossman, and U.S. Pat. No. 5,783,909 Hochstein, propose to compensate for long term LED degradation through a variable current. In these lighting devices, which deal mostly with traffic lights, the luminosity output of traffic lights using LEDs is stabilized by varying the current flow. The lighting devices measure the luminosity output of the LEDs and either increase or decrease the current being supplied to the LEDs as a result. The current control is usually performed either through proportional DC (Direct Current) control, or through PWM (Pulse Width Modulation) of the LED supply. In the context of roadway or tunnel lighting, the use of PWM to control the LED intensity may be problematic. This is because it can lead to visible stroboscopic beat effects in the light superposition of multiple lighting devices each having slightly different, non-synchronized PWM frequencies.

It would therefore be advantageous to have a different way of stabilizing the lighting device's luminosity.

SUMMARY OF THE INVENTION

Therefore the present invention provides a lighting device comprising a plurality of groups of light emitting diodes, each of said groups of light emitting diodes containing one or more light emitting diodes, each of said light emitting diodes being configured so as to pass between an energized light emitting state and a non-energized state;

luminosity measuring means for providing a standard luminosity reading at predetermined time intervals (e.g. from a test diode);

controller means for transferring, at predetermined time intervals, in response to said standard luminosity reading, one or more of said groups of light emitting diodes between a first energized group wherein said light emitting diodes are in said energized light emitting state and a second non-energized group wherein said light emitting diodes are in said non-energized state.

In one aspect of the present invention said controller means may be configured to maintain all of the light emitting diodes in said first energized group when a predetermined luminosity reading is provided by said luminosity measuring means.

In one embodiment said luminosity measuring means for providing a standard luminosity may comprise one or more test light emitting diodes coupled to light sensors, such that said test diodes can emit light which will then be measured by the light sensors. This measurement will then form the basis for said standard luminosity.

The invention further provides a lighting device comprising a plurality of groups of light emitting diodes, each of said groups of light emitting diodes containing one or more light emitting diodes, each of said light emitting diodes being configured so as to pass between an energized light emitting state and a non-energized state;

usage time measuring means for providing a usage time measurement for each of said groups of light emitting diodes at predetermined intervals (e.g by storing usage times in a memory)

controller means for transferring, at predetermined time intervals, in response to said usage time measurements, one or more of said groups of light emitting diodes between a first energized group wherein said light emitting diodes are in said energized light emitting state and a second non-energized group wherein said light emitting diodes are in said non-energized state.

In one embodiment of the present invention said controller means may be set to transfer said groups of light emitting diodes between said first energized group and said second non-energized group in response to both the standard luminosity reading and the usage time measurement.

The present invention in accordance with a particular aspect provides an illumination lighting device comprising
- a plurality of illumination groups, each of said illumination groups containing one or more light emitting diodes and being configured for passing between an energized light emitting state and a non-energized state, and
- control means for maintaining the luminosity of the lighting device at a desired level, said luminosity being controlled by, at predetermined time intervals, transferring an appropriate number of illumination groups between said energized light emitting state and said non-energized state,
- whereby
- said transfer is effected in response to a luminosity reading and/or a usage time measurement, and
- said lighting device comprises at least one of usage time measuring means for providing a usage time measurement for each of said illumination groups at predetermined time intervals, and a luminosity measuring system comprising
  i) luminosity measuring means,
  ii) one or more test light emitting diodes equivalent to the light emitting diodes of said plurality of illumination groups,
- said luminosity measuring means being able to provide said luminosity reading at predetermined time intervals, on the basis of the light of said one or more test light emitting diodes when said one or more test light emitting diodes are in an energized state, wherein said one or more test light emitting diodes are selected from among light emitting diodes which are part of said illumination groups and which are separate from said illumination groups.

In accordance with the present invention, a controller means may further comprise:
- means for detecting whether any of said illumination groups of light emitting diodes have a light emitting diode unable to pass between said energized light emitting state and said non-energized state, and for transferring a so detected group to a non-functional state.

In accordance with the present invention a lighting device is provided wherein each of the illumination groups of light emitting diodes may contain a plurality of light emitting diodes.

In accordance with the present invention a lighting device is provided wherein for the energization of light emitting diodes, the lighting device may comprise constant current source means.

In accordance with the present invention a lighting device is provided wherein the lighting device may be a single device.

It should be clear that the controller means can be configured to transfer said groups of light emitting diodes between said first energized groups and said second non-energized group in response to any suitable criteria.

In one aspect of the invention the LEDs may always be used at full current, and the lighting device's luminosity may be controlled by adjusting the number of LEDs turned On.

This method of using a single current may result in a lower LED degradation rate than other methods, because it is known that an LED used continuously at a fractional current degrades faster than an LED used for a fractional time at full current, both fractions being equal.

As an example: data provided by Toshiba, a major LED manufacturer, for its TLYH Amber LED series (such as could be used with the lighting device) indicates that at 25 deg. C. the LED luminosity will degrade by 50% in 170,000 hours when used at 10 mA, and in 140,000 hours when used at 20 mA. If the the LED were used at 20 mA only half the time (thereby getting the same average light as using it continuously at 10 mA), it would take 280,000 hours to reach the 50% degradation point, lasting substantially longer than the 170,000 hours of the continuous 10 mA option. It can therefore be seen that reducing usage time even while compensating with increased current will provide a slower degradation rate.

The invention also provides a lighting arrangement comprising:
- two or more circuit board means, each circuit board means having a projection axis and a plurality of light emitting diodes, such that any light emitted by the light emitting diodes on each of said circuit board means is projected substantially parallel to said projection axis;
- said circuit board means being disposed such that each of said projection axes are disposed at an angle to each other.

In an aspect of the present invention said angle may for example be from 5 to 15 degrees.

The invention also provides a network comprising:
- a host computer; and
- a plurality of light emitting diode lighting devices;

said host computer comprising:
- means for transmitting a request for a status report from each of said light emitting diode lighting devices,
- means for receiving a status report from each of said light emitting diode lighting devices; and
- means for transmitting a signal to each of said light emitting diode lighting devices such that the host computer can direct how much light each of said lighting devices emits; and each of said plurality of light emitting diode lighting devices comprising:
- means for receiving a request for a status report from said host computer, creating said status report, and transmitting said status report to said host computer; and
- means for receiving a signal from said host computer and altering how much light said light emitting diode device emits in response to said signal.

In one embodiment said status report may comprise current luminosity setting, current actual luminosity output, current light emitting diode degradation, current dirt accumulation, current number of light emitting diode groups in use, current number of open-circuited light emitting diode groups and current average usage time of light emitting diode groups.

The present invention further provides a method for manipulating the light intensity in a tunnel, said tunnel comprising a lighting system comprising a plurality of lighting devices, said method comprising means for raising and lowering, in unison, the luminosity level of each of said devices; (e.g. the means for raising and lowering may, for example, comprise a computer in a network as described herein or a suitable switching means or other control means able to accomplish the desired dimming or increase in light intensity).

The invention further provides a network comprising:
- a host computer; and
- a plurality of light emitting diode lighting devices;

said host computer comprising:

means for transmitting a signal to each of said light emitting diode lighting devices such that the host computer can direct how much light each of said lighting devices emits; and each of said plurality of light emitting diode lighting devices comprising:
means for receiving a signal from said host computer and altering how much light said light emitting diode device emits in response to said signal.

The invention further provides a dirt detection system for a transparent surface, comprising:
an electromagnetic radiation emitting means for emitting light;
electromagnetic radiation measurement means for measuring light;

said electromagnetic radiation emitting means and said electromagnetic radiation measurement means being configured such that said electromagnetic radiation emitting means emits a certain amount of electromagnetic radiation through said transparent surface, and said electromagnetic radiation measurement means measuring how much of said certain amount of electromagnetic radiation is reflected by said transparent surface and comparing said amount to a base measurement taken when said transparent surface is free of dirt.

The invention also provides a light emitting diode lighting device, comprising:
a plurality of groups of light emitting diodes, each of said groups of light emitting diodes containing one or more light emitting diodes, each of said light emitting diodes being configured so as to pass between an energized light emitting state and a non-energized state;
memory means for keeping track of the time each of said groups of light emitting diodes have been in said energized light emitting state;
energizing means for inducing any of said groups of light emitting diodes to pass between said energized light emitting state and said non-energized state;
a luminosity measuring system comprising one or more test light emitting diodes that are equivalent to said one or more light emitting diodes which make up said groups of light emitting diodes, and measuring means for providing a luminosity reading of the light that one or more test light emitting diodes provide when in said energized state;
storage means for storing the luminosity reading provided by said measuring means;
calculation means for calculating the number of said groups of light emitting diodes which are needed to provide a light of a desired luminosity, herein referred to as X, said calculation being based on the luminosity reading stored in the storage means;
partitioning means for temporarily assigning said groups of light emitting diodes to a first energized group or to a second non-energized group; and
timer means for causing, every time a predetermined time has elapsed, the luminosity measuring system to provide a new luminosity reading, and the partitioning means to partition said groups of light emitting diodes;

said partitioning means comprising:
means for causing said calculation means to calculate X,
means for selecting the X groups of light emitting diodes which have spent the least amount of time in said energized light emitting state and assigning them to said first energized group,
means for assigning the remaining groups of light emitting diodes to said second non-energized group, and
means for causing said energizing means to induce the groups of light emitting diodes assigned to said first energized group to pass to said energized light emitting state, and to induce the groups of light emitting diodes assigned to said second non-energized group to pass to said non-energized state; and the total number of groups of light emitting diodes (X+Y) in the lighting device being such that Y is non-empty for the majority of the lifespan of the lighting device.

In one aspect the light emitting diode lighting device may further comprise:
a heat dissipation means for dissipating heat generated by said groups of light emitting diodes.

In one aspect the light emitting diode lighting device may further comprise:
a light emitting diode status monitoring system having means for monitoring whether any of said groups of light emitting diodes have become incapable of being energized, and means for communicating which of said plurality of light emitting diodes can still be energized to the partitioning means.

In one aspect the light emitting diode lighting device may further comprise:
a dirt detection means being configured to detect the amount of dirt on the outer surface of the lighting device and communicating this amount to the calculation means so that the calculation means may compensate for the dirt by increasing the light provided by the lighting device.

In one aspect the light emitting diode lighting device may further comprise:
network connection means for connecting to a network, said network connection means being configured to communicate with a host computer and the central control unit such that the host computer may alter said required amount of light.

In one aspect the light emitting diode lighting device may further comprise:
a light emitting diode status monitoring system having means for monitoring whether any of said groups of light emitting diodes have become incapable of being energized, and means for communicating which of said plurality of light emitting diodes can still be energized to the partitioning means;
a dirt detection means being configured to detect the amount of dirt on the outer surface of the lighting device and communicating this amount to the calculation means so that the calculation means may compensate for the dirt by increasing the light provided by the lighting device;
network connection means for connecting to a network, said network connection means being configured to communicate with a host computer and the central control unit such that the host computer may alter said required amount of light; and
a status indicator means connected to said luminosity measuring system, said dirt detection means, and said network connection means such that if the measured luminosity falls beneath a predefined amount, the amount of dirt on the outer surface goes above a certain amount, or if the network connection means is unable to communicate with the host computer then the status indicator means will turn on a signal.

It is to be understood herein, that if a "range" or "group of substances" is mentioned with respect to a particular characteristic (e.g. angles, wavelengths and the like) of the present invention, the present invention relates to and explicitly incorporates herein each and every specific member and combination of sub-ranges or sub-groups therein whatsoever. Thus, any specified range or group is to be understood as a shorthand way of referring to each and every member of a range or group individually as well as each and every possible sub-ranges or sub-groups encompassed therein; and similarly with respect to any sub-ranges or sub-groups therein. Thus, for example, with respect to angles from 5 to 15, would include for example 5.1, 5.2, 6, 5 to 6, 6 to 7, 5 to 7, and so on.

with respect to wavelengths 0.1 millimeters to 10 nanometres would include for example 0.09 millimeters, 10.1 nanometres, 10.2 nanometres, 100 nanometres to 10 nanometres, 0.1 millimetres to 100 nanometres, and so on.

BRIEF DESCRIPTION OF THE DRAWINGS

FIG. 1 shows an embodiment of lighting device of the invention mounted on a ceiling.

FIG. 2 shows the configuration of two LED arrays in the lighting device of FIG. 1.

FIG. 2A shows the lighting device using the LED arrays of FIG. 2 mounted on a ceiling in a tunnel FIG. 3 show a side view of an LED array of FIG. 2, having a heat dissipation means.

FIG. 9 shows a diagram of another example embodiment of a LED status monitoring system for use with the lighting device of the invention.

FIG. 10 shows a diagram of one possible network structure for multiple lighting devices.

FIG. 11 shows a diagram of another possible network structure for a great number of lighting devices.

FIG. 12 shows a diagram of a lighting area, e.g. a tunnel divided into several zones.

FIG. 13 shows a flow diagram of the logic of the host computer of the network of lighting devices.

FIG. 14A shows a top view of a tunnel mounted with several lighting devices of the invention FIG. 14B is a cross-section of the tunnel shown in FIG. 14A along line 14-14, showing the ideal lighting profile of a lighting device.

FIG. 16A shows a front and a side view of the projection angle of an LED having a oval projection cone.

FIG. 16B shows a diagram of the projection pattern of the LED of FIG. 16A.

FIG. 18 shows example lane use signals.

DETAILED DESCRIPTION

Figure 4:
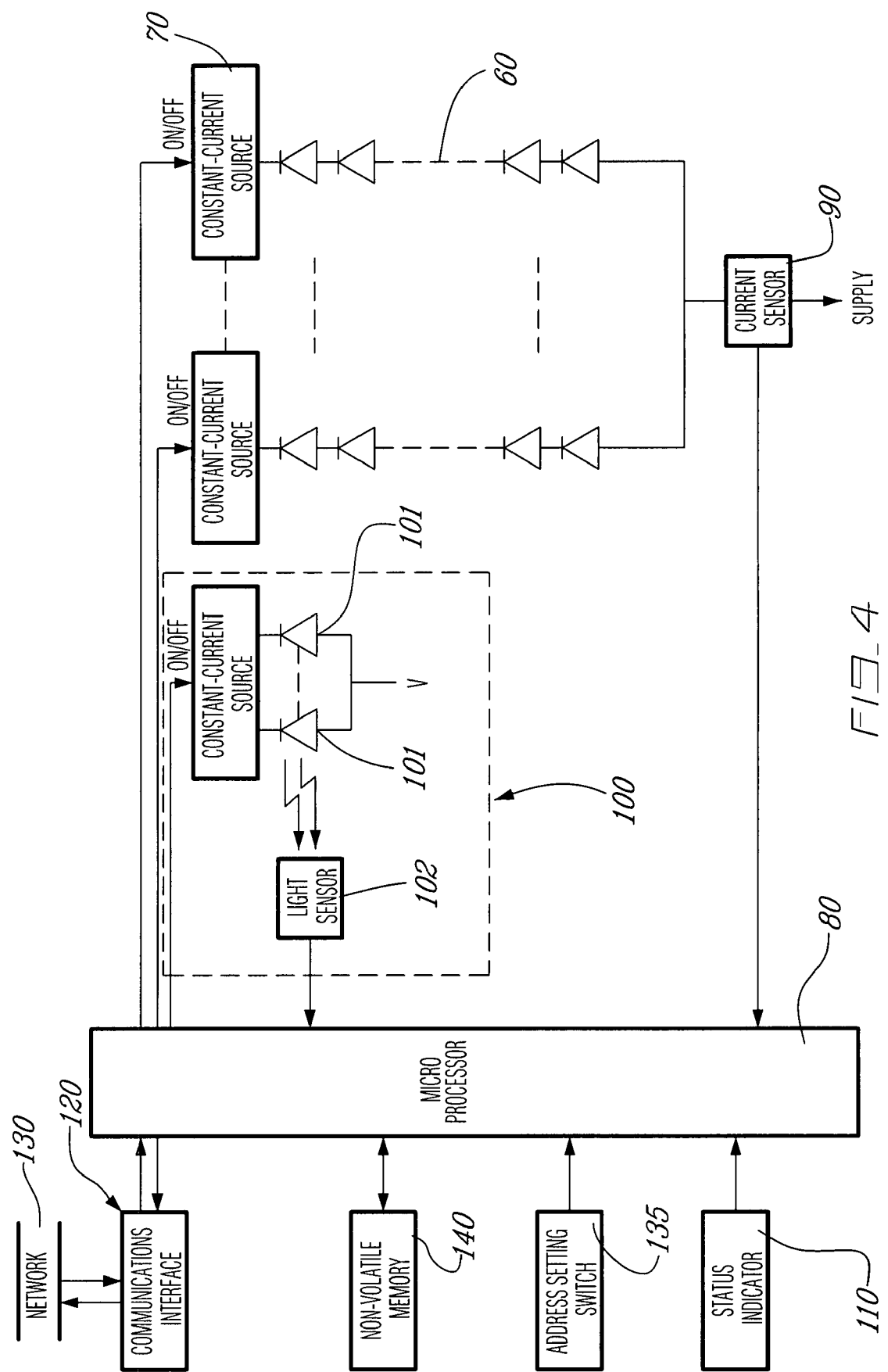
FIG. 4 shows a diagram of the different parts of the lighting device shown in FIG. 1.

FIG. 1 shows a lighting device 1 of the invention, having a lighting device casing 2 with a transparent face 3 in front of a LED array 10. To ensure long-term reliability the casing 2 is environmentally sealed, so that dust and water cannot penetrate inside.

The casing 2 has a shape such that when the lighting device 1 is installed in its normal position (e.g. on the ceiling of a tunnel facing downwards), its light emission axis 4 is tilted by an angle 5 from the vertical axis 6, towards the incoming traffic. This angle 5 can range from −90 to +90 degrees (e.g. 0 to 80 degrees). Light distribution simulations show that having the angle 5 in the range of 60 to 70 degrees allows for optimization of the illuminance. It should of course be noted that any sufficient angle may be used.

In the embodiment of the invention shown in FIG. 2, the lighting device 1 has as its main illumination source of an array of individual LEDs 10. The LEDs 10 are assembled on one or more printed circuit board sections 20, such that the LEDs 10 are perpendicular to the surface of said circuit board sections 20. The number and type of LEDs per section can vary, according to the luminance level required of the lighting device.

As an example, a circuit board section can contain 780 LEDs, arranged in a rectangular array of 26×30 LEDs. The lighting device 1 would contain one or more such circuit board sections 20.

As can be seen in FIG. 2, the circuit board sections 20 are angled with respect to each other. The result is that the light emission axes of the circuit board sections 20 are slightly out of sync with the ordinary light emission axis 4, for example from 2.5 to 7.5 degrees, though other suitable angles can be used. FIG. 2A shows the lighting device mounted on a ceiling in a tunnel. The angling of the circuit boards allows for the lighting device to conform to specific lighting uniformity standards. And is described in greater detail below.

Some lighting installation standards require specific illuminance levels over the lighted areas, with a lighting uniformity that must remain within certain bounds. Lighting uniformity is usually specified using the minimum illuminance over the lighted area (herein referred to as Min), the maximum illuminance (herein referred to as Max), and the average illuminance (herein referred to as Mid). As an example, specifications for tunnel lighting typically require a ratio of Min/Max above 30%, together with a ratio of Min/Mid 50%.

It has been determined that for tunnel lighting a way to meet the requirements is to use a series of identical lighting devices 1 in a counter beam orientation 290 at regular spacing (herein referred to as $D_{device}$ 292), as illustrated in FIG. 14A. The experiments have shown that ideally each lighting device should have a lighting pattern with a lateral light projection angle $A_{lateral}$ (herein designated with the reference number 294) wider than the vertical projection angle $A_{vertical}$ (herein designated with the reference number 296), i.e. a rectangular-shaped intensity profile 298, as shown in FIG. 14B. FIG. 14B shows the iso curve of an idealized equal lighting intensity boundary, as seen in a cross-section plane perpendicular to the tunnel main axis. FIG. 14A also shows the direction of traffic by arrow 300.

The lighting device of the invention in this embodiment seeks to meet the specifications for public lighting installations using the above described method. It should also be noted that while targeted to this approach, other embodiments could be conceived in which different approaches are used to satisfy the specifications for public lighting installations.

Figure 15B:
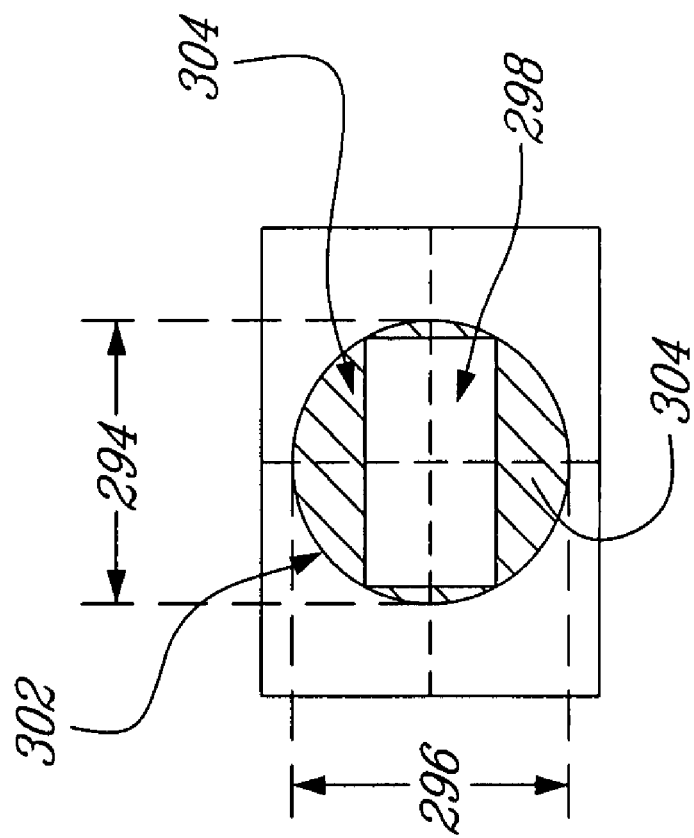
FIG. 15B shows a diagram of the projection pattern of the LED of FIG. 15A.
Figure 15A:
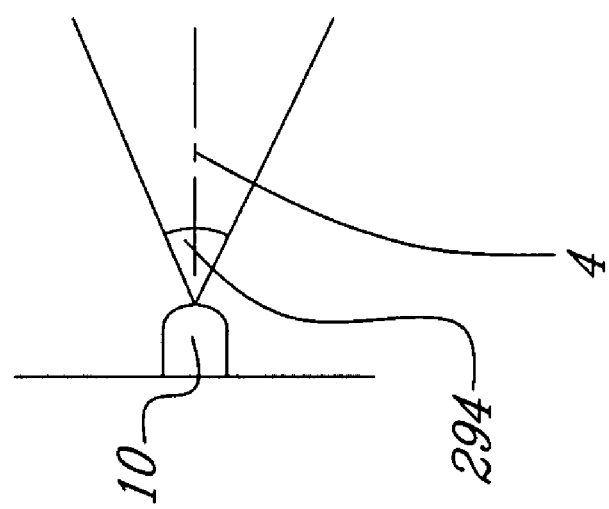
FIG. 15A shows a side view of the projection angle of an LED having a symmetrical projection cone.

The most simple way to match the rectangular light projection pattern 298 with a LED lighting device is to use normal LEDs having symmetrical lateral and vertical projection angles $A_{lateral}$ 294 and $A_{vertical}$ 296 equal to the wider of the required angles (i.e. $A_{lateral}$), the LEDs being installed on a printed circuit board oriented such that the light projection axis is aligned with the lighting device light emission axis 4. FIG. 15A illustrates this symmetrical approach. The projection pattern for the symmetrical method can be seen in FIG. 15B, which shows the circular projection pattern 302 of the approach, with the idealized projection pattern 298. As can be seen some light is wasted in the upper and lower vertical areas 304 of the circular projection pattern.

FIGS. 16A and 16B show another way to obtain a better match to the idealized pattern 298, using special LEDs with an oval intensity profile. FIG. 16A shows the projection angles of the oval LEDs. Clearly $A_{lateral}$ 294 is wider than $A_{vertical}$ 296. FIG. 16B shows the projection pattern for the oval LEDs of FIG. 16A. As can be seen, the oval projection pattern 306 is much closer to the idealized projection pattern 21. Oval LEDs are available on the market but the choice of anamorphic ratio ($A_{lateral}/A_{vertical}$) is too limited and the available intensity profiles do not lead to optimal results. LED manufacturers can develop custom intensity profiles but the cost would be prohibitive.

Another way to obtain a similar pattern is to use normal LEDs with smaller projection angles and to add special diffusion optical devices (such as lenses or holographic filters) to stretch the intensity profile into an oval shape similar to that shown in FIG. 16B. The drawback of this method is increased complexity and costs.

As can be seen none of the above patterns are really desirable due to increased cost and wasted light. The present invention therefore proposes still another approach that is more simple, flexible and cost-effective. Simulations and experiments show that the required projection pattern can be obtained using normal LEDs with a symmetrical projection angle close to $A_{vertical}$ and installing them on multiple printed circuit board sections with a slight angular tilt between each section so as to stretch the lateral projection angle $A_{lateral}$.

Figure 17B:
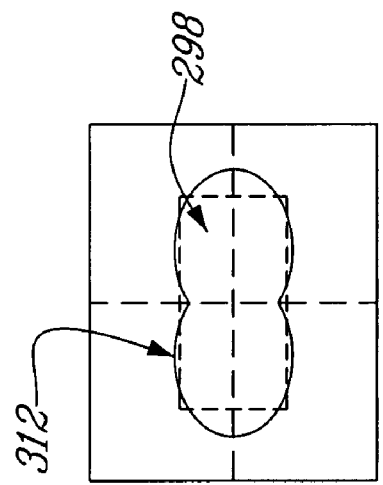
FIG. 17B shows a diagram of the projection pattern of the LEDs of FIG. 17A.
Figure 17A:
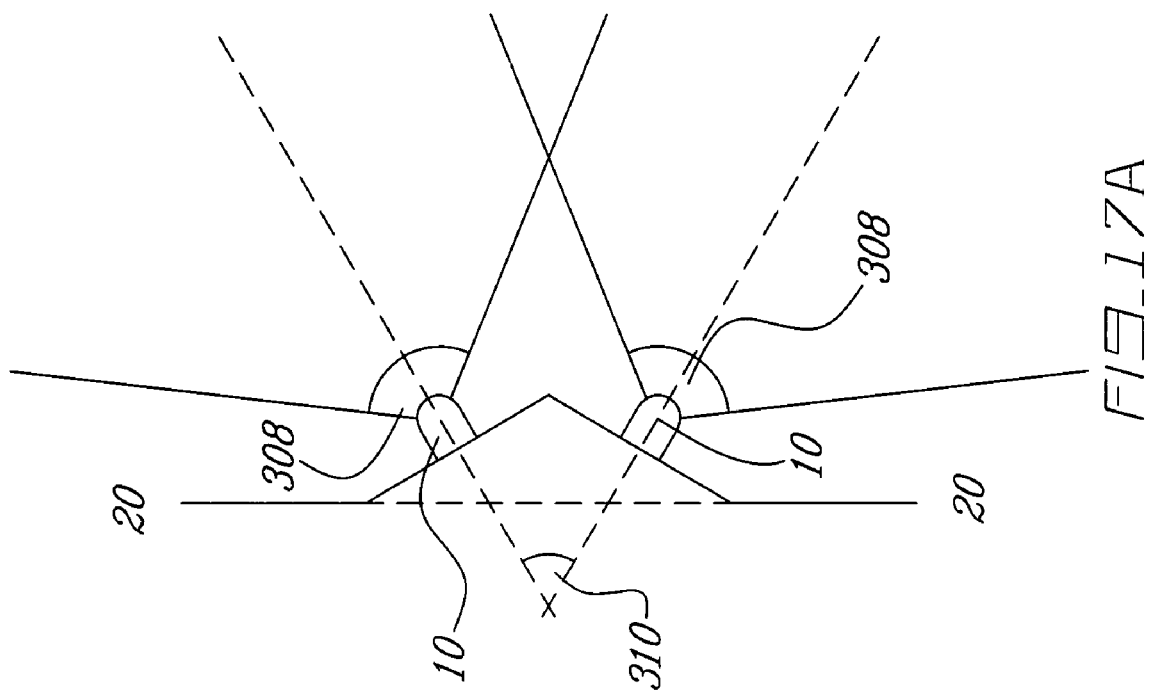
FIG. 17A shows a side view of the composite projection angle of two LEDs according to one embodiment of the invention.

FIG. 17A shows such an arrangement, with 2 LED 10 having a projection angle "beta" (herein designated with the reference number 308) being disposed on circuit board sections 20. The circuit board sections 20 are tilted such that the LEDs are disposed at an angle "Alpha" (herein designated with the reference number 310) to each other. FIG. 17B shows the resulting "peanut-shaped" intensity profile 312. As can be seen for the figure a very close match to the idealized rectangular pattern 298 can be achieved using the peanut-shaped intensity profile 312.

The angles "alpha" and "beta" are to be selected, for example, to match the road width, the uniformity photometric ratios to be maintained, the distance between each lighting device and finally by the tilt angle of the lighting device. The number of LEDs required by each lighting device is determined by the overall illuminance requirement.

As an example, a simulation for lighting devices made of 780 LEDs distributed on two printed circuit boards at a tilt angle "alpha" of 10 degrees, each having 390 LEDs with a projection angle "beta" of 17 degrees. Calculations showed that one lighting device per spacing $D_{device}$=2 meters was required in order to obtain the required illuminance for a typical tunnel. This approach yielded good uniformity values Min/Max=50% and Min/Mid=75%. Results have shown that in this application the optimal value for the angle alpha will typically be between 5 and 15 degrees. It should be noted that other less optimal angles can be used.

The resulting approach is very flexible because it uses standard LEDs currently available on the market without any special requirement on the intensity profile. The solution is therefore not limited by one LED manufacturer's custom design. New lighting devices can also be updated easily by developments in LED industry: if more candelas is available per LED in standard LEDs, the approach can get the benefit of the improvement without major redesign of the lighting devices.

Moving on to FIG. 3, which shows a heat dissipation means 30 for use with the lighting device 1. The heat dissipation means in this embodiment comprises a heat conductive compound 40, and a heat sink 50. The heat generated by the LEDs is transmitted through the heat conductive compound 40 to the heat sink 50, which dissipates it.

The heat dissipation means 30 is included with the lighting device 1 since LED output gradually decreases with usage time. As an example, a typical LED will see its light output decrease by 25% after 100,000 hours. The rate of this degradation increases as the junction temperature of the LED increases. As an example, a typical LED will see the same degradation in 140,000 hours at 25_C as in 110,000 hours at 60_C. It is therefore important to keep the junction temperature of the LED as low as possible, in order to increase its life expectancy.

Most of the heat generated by a LED 10 is dissipated through its leads 11. In the lighting device 1 the junction temperature of the LEDs 10 is minimized by the inclusion of heat dissipation means 30. The current invention proposes to minimize the LED junction temperature by maximizing the transfer of heat through the LED leads. This may be achieved as follows:

First the LED leads 11 are cut so that they stick out of the printed circuit boards 20 to a certain length. Second the space between the LED leads is filled with the compound 40 which is conductive to heat but not to electrical current. And example of an appropriate compound would be a thermally conductive silicone paste. The compound 40 will cover the whole surface of the printed circuit board on the opposite side of the LEDs. The thickness of the compound 40 should be slightly greater than the length of the LED leads 11 so that no leads 11 extend out of the compound 40. Finally a metallic heat sink 50 is applied in contact with the compound 40, to dissipate the heat transferred from the leads 11 through the compound 40. This heat sink 50 can alternately be integrated with the body of the lighting device casing 2.

In an alternate method the LED leads 11 can be cut so that they do not protrude from the printed circuit boards 20. A thermally conductive soft elastomer sheet would then be placed between the printed circuit board 20 and the heat sink 50. And example of this kind of sheet is made by the manufacturer Thermagon.

FIG. 4. shows an electronic diagram of the lighting device 1 shown in FIG. 1. FIG. 4 shows that the LEDs 10 are grouped in a plurality of groups of LEDs 60. An example design could have for instance 78 groups of 10 LEDs each.

Connected to each groups is a constant current source 70 which can turn the group either on or off. The constant current sources 70 are connected to a microprocessor 80. The microprocessor 80 is set to control the lighting device, and is in this embodiment of the invention a controller means. In the case of the current sources 70 the microprocessor 80 has an energizing means which controls which of the current sources 70 are turned on and which are turned off, thereby controlling each of the groups of LEDs 60. The energizing means comprises in this embodiment a suitably programmed computer method for the microprocessor 80. This suitable programming meaning being capable of taking as its input two lists of LED groups, one list containing the LED groups which are to be turned on and one list containing the LED groups which are to be turned off. The suitable programming further being capable of signalling each of said current sources 70 to either activate or de-activate based on said lists.

The group structure of the LEDs is desirable because it allows great control of the LEDs while not taking up as much circuitry as individual control of each individual LED. Furthermore the group structure is very flexible in allowing for variable dimming of the luminosity level of the lighting device. The luminosity level will be adjustable by controlling the number of LED groups turned On or Off.

In the example design containing 78 individual LEDs groups per printed circuit board, the luminosity will be adjustable with a resolution of 100/78=1.28%. As can be seen the groups structure method of dimming allows for great flexibility in dimming and further allows the LED groups to use only a single current level thus simplifies the circuitry of the lighting device.

Additionally, to prevent power transients when the tunnel lighting is turned On or Off, or when its dimming level is changed the microprocessor in each lighting device will automatically make any luminosity transition gradual. This is achieved by turning LEDs group On or Off one by one, with a slight time delay between each group.

While in this embodiment the current source 70 is a constant current source, it could also be a variable current source. A variable current source has certain advantages in that it could be used to implement a long term LED degradation compensation system in which the current source could supply more power to compensate for lower output by the LEDs over time.

Also connected to the groups 60 is a LEDs status monitoring system 90 which monitors the current flowing through the LEDs groups 60 in order to identify any defective LED groups.

The lighting device further includes a luminosity measuring system 100 which will measure the luminosity of one or more test LEDs 101, in order to regulate the luminosity output of the lighting device.

The system in this aspect also includes status indicator means 110 which has a light that is visible from the outside of the lighting device. The status indicator 110 will be activated by the microprocessor when the lighting device requires servicing. The status indicator 110 normally has two modes, but can be extended to allow for further modes. The normal modes are NORMAL in which the light is off and the lighting device is functioning normally. The second mode is END OF LIFE in which the light is turned on. In this mode the lighting device has detects that the LEDs have degraded beyond a predetermined cutoff point. In the embodiment of the lighting device shown in FIG. 4, the status indicator has two further modes. These first of these modes is CLEANING NEEDED in which the light is set to slowly flash. In this mode the lighting device has detected that the transparent face of the casing has become too filthy and that the lighting device requires cleaning. The final mode is NO CONNECTION in which the light is set to quickly flash. In this mode the lighting device has detected that it has lost its connection to a network and a host computer. The status indicator, its modes, and how each mode is detected will be explained in greater detail below.

The lighting device also includes network connection means 120, for connecting the lighting device to a network 130. Through the network a host computer can monitor the status of the lighting device, and set the luminosity output of the lighting device.

The lighting device can also include an address setting switch 135 which can be access from the outside of the lighting device, either manually of through a remote signal. When the address setting switch 135 is activated a signal is sent through the microprocessor 80 to the network connection means 120. The network connection means then contacts the host computer through the network and request a network address for the lighting device.

Finally, the lighting device contains a non-volatile memory 140, which can be used to store various information which the microprocessor 80 needs to perform its function. Such information can include the lighting devices network address, the luminosity of a standard LED, and the current luminosity setting of the lighting device.

The microprocessor 80 shown in FIG. 4, implements several useful functions for the lighting device. In addition to the energizing means which aids in the variable dimming capacity and control of the LED groups, the microprocessor 80 has several means which allows the lighting device to compensate for long-term luminosity degradation. These means are timer means which is a software method which keeps track of time, calculation means which is a software method capable of calculating the number of LED groups which are needed to provide the required light, and partitioning means which is a software method for selecting which LED groups to turn on. Each of these means will be described in greater detail below.

One main long-term luminosity degradation compensation of the system may be based providing more groups of LEDs than are require at the start of the life cycle of the lighting device. The number of LEDs required to generate the specified luminosity of the lighting device at the start of its life-cycle can be determined using the initial LED specifications. It is known that as the LEDs age, their output luminosity will gradually decrease, or equivalently more LEDs will be required to achieve the specified luminosity. The lighting device may therefore be designed with a number of extra LED groups which are sufficient to maintain its specified luminosity up to the end of its life-cycle. The number of extra groups of LEDs varies, and the calculation of this number will be explained in greater detail below.

At certain intervals in the life-cycle of the lighting device, the timer means of the microprocessor causes the calculation means to calculate the number of necessary LED groups. This calculation is based on an idealized LED luminosity which it obtains from the luminosity measuring system 100, as shown in FIG. 4. As the luminosity of the test LEDs of the luminosity measuring system 100 degrade the calculation means will turn on more of the extra LEDs groups to maintain the luminosity of the lighting device. Which of the groups to turn on is selected by the partitioning means, which follows an algorithm which will be described in greater detail below.

The number of extra LED groups may be estimated as follows:

Estimation of the Number of Extra LED Groups:

The LED Array of the lighting device is designed with a number of extra LEDs groups sufficient to maintain its specified luminosity up to the end of its life-cycle. The life-cycle of the lighting device is predetermined and may be for instance between 10 and 15 years. The extra LEDs groups will gradually be used as the lighting device ages.

The number of extra groups is determined as follows, using this set of definitions:

$L_{tot}$=Total Luminosity of the lighting device
$N_{on}(t)$=Number of groups turned On (as a function of time) to maintain constant $L_{tot}$
$L_{led}(t)$=Luminosity (as a function of usage time) for a typical LED
$t_{elc}$=End-of-Life-Cycle time
$n_{led}$=Number of LEDs per group
$N_{start}$=Number of LED groups needed at life-cycle startup (t=0)
$N_{extra}$=Number of extra groups needed to maintain Total Luminosity $L_{tot}$ at End-of-Life-Cycle time $t_{elc}$
$N_{group}$=Total number of groups in lighting device At any given time, the microprocessor monitors $L_{led}(t)$ through the monitor LEDs. It then adjusts the number $N_{on}(t)$ of groups turned On so that the Total Luminosity $L_{tot}$ of the lighting device remains constant, according to the following relation:

$$L_{tot}=N_{on}(t)*n_{led}*L_{led}(t) \quad (1)$$

From which is obtained:

$$N_{on}(t)=L_{tot}/\{n_{led}*L_{led}(t)\} \quad (2)$$

At start of life-cycle (t=0):

$$N_{start}=N_{on}(0)=L_{tot}/\{n_{led}*L_{led}(0)\} \quad (3)$$

where $L_{led}(0)$ is the start-up LED luminosity.

$N_{on}(t)$ will gradually increase as Lied decreases with LED age. The total number $N_{group}$ of LED groups in the lighting device must be high enough to satisfy (2) at the End-of-Life-Cycle time, when LED luminosity will be at its minimum:

$$N_{group}=N_{on}(t_{elc}) \quad (4)$$

After combining (2) and (4):

$$N_{group}=N_{on}(t_{elc})=L_{tot}/\{n_{led}*L_{led}(t_{elc})\} \quad (5)$$

Since by definition:

$$N_{extra}=N_{group}-N_{start} \quad (6)$$

(3), (5) and (6) can be combined to obtain:

$$N_{extra}=L_{tot}/\{n_{led}*L_{led}(t_{elc})\}-L_{tot}/\{n_{led}*L_{led}(0)\} \quad (7)$$

The End-of-Life-Cycle luminosity $L_{led}(t_{elc})$ can be obtained from the LED manufacturer=s specifications sheet. This value is also dependent on ambient temperature and LED junction current, so these factors must be taken into account when evaluating the number $N_{extra}$ of extra LED groups for the lighting device.

Equation (7) is in fact a worst-case approximation of $N_{extra}$, because by using $L_{led}(t_{elc})$ as the End-of-Life-Cycle LED luminosity it is assumed that the LEDs are always On during the full life-cycle of the lighting device. This is in practice not the case because in the early life of the lighting device, only $N_{start}$ groups out of the total $N_{group}$ are On. This means that on average the LEDs degrade less rapidly than estimated with (5).

The average degradation of each LED may be further improved by an automatic LED usage equalization mechanism implemented in the lighting device. In this mechanism, the microprocessor continuously performs a rotation of the LED groups turned On. This rotation is kept slow enough (e.g. once per hour) so as not to be noticeable by casual observers. In this way, even if not all groups out of the total available $N_{group}$ are required during the lighting device's early life, all $N_{group}$ groups are still exercised equally on average and therefore degrade equally in the long term.

The automatic LED usage equalization mechanism will be explained in greater detail later.

Taking this mechanism into account, a new reduced value for the number of extra groups $N_{extra}$ (herein referred to as Nauto$_{extra}$) is obtained. This involves an integration of the LED luminosity $L_{led}(t)$ over the averaged actual LED On time during the complete lighting device life-cycle. Typically Nauto$_{extra}$ can be reduced by a factor of 20% to 50% over the value $N_{extra}$ given by (7), depending on the specific Luminosity curve $L_{led}(t)$ of the LEDs during the lighting device life-cycle.

Example of Values Obtained for a Typical Lighting Device:

Below are shown example values obtained for a lighting device using typical Amber-colored InGaAIP LEDs.

The following is assumed:
$L_{tot}$=1500 cd (candelas) total lighting device luminosity
$n_{led}$=10 LEDs per group
$t_{elc}$=10 years End-of-Life-Cycle time
$T_{ambient}$=25EC ambient temperature
$I_{junction}$=20 mA (milliAmperes) LED junction current The LED manufacturer specifies:
$L_{led}$ at start-up time (t=0)=3.5 cd (candelas)
$L_{led}$ at End-of-Life-Cycle (t=10 years)=55% of $L_{led}(0)$ =1.92 cd According to (3):
$N_{start}=L_{tot}/\{n_{led}*L_{led}(0)\}$=1500/(10*3.5)=43 LED groups needed at start-up.

According to (5):
$N_{group}=L_{tot}/\{n_{led}*L_{led}(10y)\}$=1500/(10*1.92)=78 LED groups needed at End-of-Life Therefore, according to (6):
$N_{extra}=N_{group}-N_{start}$=78−43=35 extra LED groups to compensate for LED degradation Taking into account the Automatic LED Usage Equalization mechanism:
Nauto$_{extra}$=25 extra LED groups, or a reduction of about 28% over $N_{extra}$ For the long term degradation compensation of the lighting device to be effective it is important that the calculation means has an accurate idea of the current luminosity output of the LED groups. Therefore, in addition to the LED groups, this system will use one (or more) test LED 101 opto-coupled to a light intensity-measuring device 102, as shown in FIG. 4. The light intensity measuring devices 102 can be for instance photodiodes or any appropriate light sensor. When desired the light intensity-measuring devices 102 can measure the luminosity output of the test LEDs 101, and obtain a standard luminosity for the LEDs of the lighting device.

The test LEDs 101 will be identical to the LEDs used in the groups, supplied with the same constant current, kept at the same temperature as the group LEDs, and turned On and Off in such a way as to maintain or reflect the same or analogous long-term usage rate as the group LEDs, as described below.

As will be described in details later, the lighting device has a controller means to count and store the cumulative usage time during which each LED group is activated, and further implements an Automatic LED Usage Equalization mechanism to ensure that on average all LED groups are used for the same cumulative time. The same controller means also counts and stores the cumulative usage time of the test LEDs, and at regular intervals automatically activates the test LEDs long enough to ensure that their cumulative usage time is equal to that of the group LEDs.

For example the controller means could activate test LEDs every time the average cumulative usage time of the lighting LEDs exceeds the cumulative usage time of the test LEDs, and turn the test LEDs off every time the cumulative usage time of the test LEDs is greater than or equal to the cumulative usage time of the lighting LEDs.

The light intensity-measuring device 102 coupled to the test LEDs 101 is read by the controller means. By comparing the test intensity to a reference value, the calculation means can estimate the LED luminosity variations at any given moment and compensate by adjusting the number of LEDs groups turned ON, thereby regularizing the overall lighting device luminosity.

Figure 5:
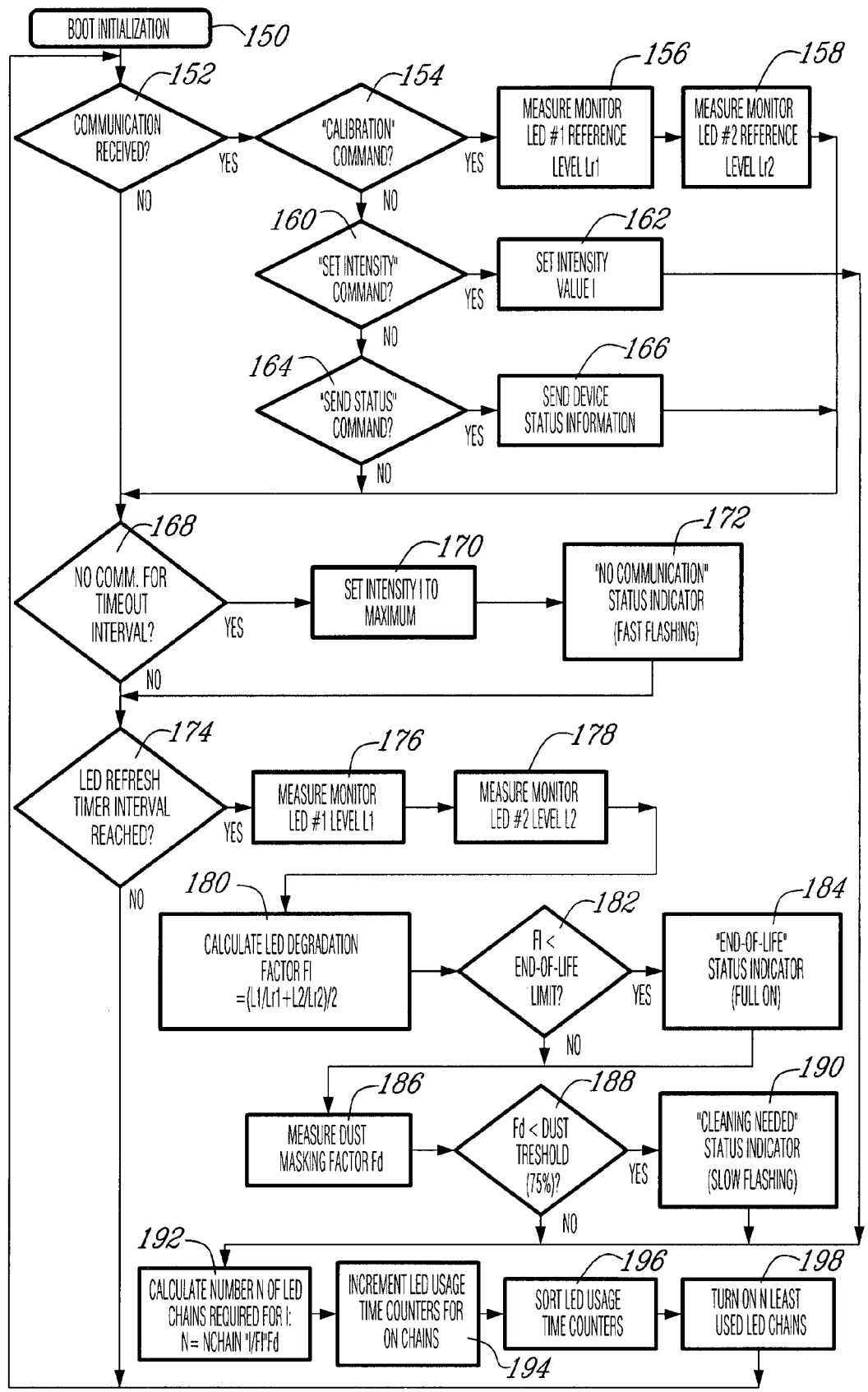
FIG. 5 shows a flow chart of the logic of the microprocessor shown in FIG. 4.

The comparison to the reference values can be seen in FIG. 5, reference number 180. The test intensities L1 and L2 are measured in 176 and 178. These values are then compared to reference values Lr1 and Lr2 which are set during the calibration of the lighting device (154, 156, 158). The LED degradation factor FI is calculated using the following formula FI=((L1/Lr1)+(L2/Lr2))/2. As can be seen from the formula the LED degradation factor is averaged over the test diodes such that in the case of abnormal behaviour in one test LED the results will not be completely skewed.

Number of Test LEDs Provided with a Typical Lighting Device:

It is preferable to have more than one Test LED, in case the Test LED fails or has abnormal degradation behavior. The probability of these occurrences simultaneously to more than one LED is proportionally smaller.

Since LEDs have a typical MTBF (Mean Time Before Failure) in the millions of hours, the probability of these occurrences for one LED is already very low during the lighting device life cycle. Therefore using 2 test LEDs is considered sufficient to obtain a very reliable system.

The number of test LEDs is not related to the number of lighting LEDs in the lighting device: the test LEDs=behavior is independent of the number of lighting LEDs.

Separate Test LEDs

In order to provide an accurate picture of the lighting device's lighting LEDs state, the test LEDs must operate under identical conditions: same junction current, same temperature, same usage time.

The most direct way to accomplish this is simply to use some of the lighting LEDs as test LEDs. However this has the following drawbacks:

Each test LED must be optically coupled to a light intensity-measuring device, such as a semiconductor photo-sensor. Furthermore, no outside light must filter in this coupling, so that the intensity measurement accurately reflects the Test LED intensity. Such a coupling + photo-sensor assembly can take a substantial amount of physical space in front of the Test LED (typically at least one inch). Using a lighting device's lighting LED as Test LED would require to provide this space between the whole LEDs PC-Board and the lighting device's transparent display window, therefore substantially increasing the overall lighting device's dimension.

Because of the automatic LED usage equalization mechanism, the lighting LEDs groups are turned On and Off in an unpredictable way as the lighting device ages and the LED groups' usage goes through a rotation. It can therefore be impractical to wait until a particular lighting LED used as Test LED is turned On by this mechanism in order to be able to make an intensity measurement.

Lighting LEDs are organized in groups of typically 10 LEDs. If a single LED out of a group fails and becomes open-circuited, the whole group fails. This means that the MTBF of a complete group is substantially smaller than the MTBF of each LED. Using a lighting LED as Test LED is therefore less reliable than using an individually connected Test LED.

To overcome these issues separate test LEDs driven with individual current sources can be used. In order to obtain an accurate operation, the following precautions are taken:

Test LEDs are driven with the same junction current as the lighting LEDs.

Thermal modeling inside the lighting device shows that the ambient temperature is quite equalized throughout the lighting device. Therefore the test LED ambient temperature is close to or the same as that of the lighting LEDs.

The microprocessor implementing the automatic LED usage equalization mechanism simultaneously turns the test LEDs On and Off so that they maintain an averaged usage time equal to that of the lighting LEDs. Because they are independent from the lighting LEDs, the test LEDs can be turned On whenever intensity measurements are required.

These precautions ensure that the test LEDs will degrade in the same way as the lighting LEDs.

Automatic LED Usage Equalization

At each stage in the course of the lighting device life, a variable number of LEDs groups will be On or Off, according to the dimming level requested and the luminosity compensation mechanism. The memory means 140 shown in FIG. 4, will keep count of the usage time of each of the LEDs group in the LED Array, and store these individual usage time values.

When selecting which LEDs groups to turn On at any given time, the partitioning means will automatically prioritize the use of LEDs groups having the shortest usage time. This prioritization is achieved by programming the partitioning means to follow the following algorithm:

sort the LED groups by usage time;
selecting the appropriate number of groups with the least amount of usage time.

This prioritization will ensure that all LEDs have an equalized usage time with no LED degrading faster than others, therefore optimizing the long-term luminosity degradation and stability of the lighting device.

The interconnections of the timer means, calculation means, luminosity measuring system, and the partitioning means can be seen in greater detail in FIG. 5, which shows flow of logic in the microprocessor 80 shown in FIG. 4.

After boot initialization 150 the microprocessor waits. Periodically it checks whether a communication has been received from the network. The lighting device can receive three kinds of communications, a calibration command 154, mainly used during factory start-up, which causes reference values for luminosity degradation calculation to be set; a set intensity command 160 which causes the light intensity output of the lighting device to be set to a new value 162; and a-send status command 164 in which the lighting device is requested to send its status to the host computer. The status of the lighting device includes all pertinent information, comprising current luminosity setting, current actual luminosity output, current LED degradation factor, current dirt accumulation factor, current number of LED groups in use, current number of open-circuited LED groups and current average usage time of LED groups. For definitions of these factors and numbers please see below.

If no communication has been received by the lighting device for a predetermined time then the lighting device assumes that its link to the network 130 has been lost and sets the status indicator 110 (see FIG. 4), to the NO COMMUNICATION mode. Finally the microprocessor, periodically recalculates the number of active groups in the lighting device and rotates the active groups. Seen in FIG. 5, this happens when the microprocessor checks the timer means in 174. If a certain interval has elapsed, the luminosity measuring system as seen in FIG. 4, is activated and new luminosity readings are taken, and the percentage of LED degradation factor is calculated (176, 178, 180). This new LED degradation factor is checked against a preset value (for instance 55%) to see if the lighting device has reached its end of life. If yes then the status indicator 110 (see FIG. 4), is set to the END OF LIFE mode.

Figure 6:
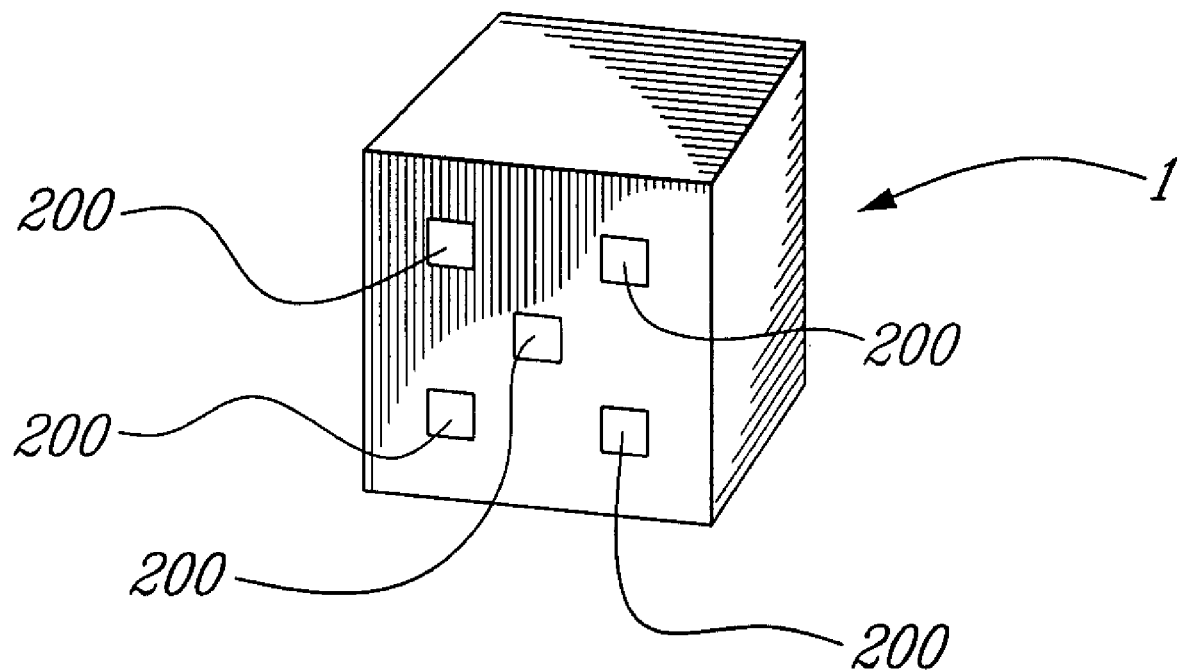
FIG. 6 shows a perspective front view of the lighting device shown in FIG. 1, with dirt detection sensors showing.
Figure 7:
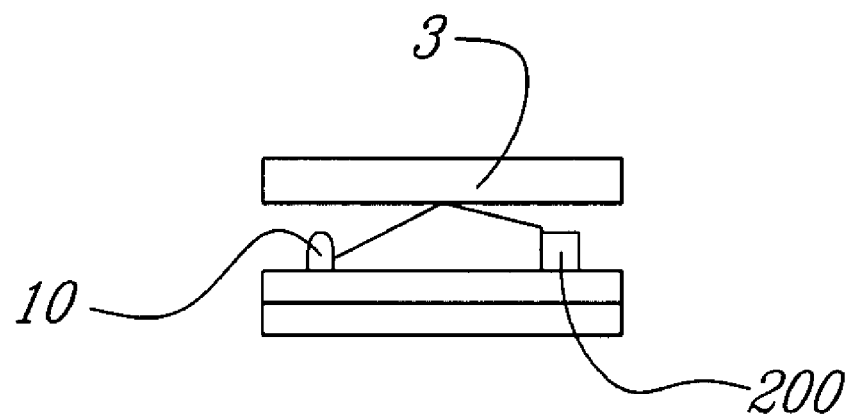
FIG. 7 shows a side view of the lighting device shown in FIG. 6, with the casing removed.

At this point an optional dirt detection means may be called into use. Turning to FIGS. 6 and 7, which show the dirt detection means comprising of a plurality of light sensors 200, disposed inside the lighting device 1. The dirt detection means functions as follows:

The lighting device's light source sends out light outside the lighting device through the transparent face 3. When the transparent face 3 is clean, there is hardly any light reflection inside the lighting device. On the other hand, as the dirt level increases, so does the light reflection level. Therefore, the light sensors 200 will measure the light level reflected inside the lighting device, determine the dirt level, compare both results with preprogrammed data in the microprocessor, and, if required, trigger an alarm informing the lighting device network operator of the current status.

In an alternate embodiment the sensors 200 can be set to detect electromagnetic radiation corresponding to a wavelength from 0.1 millimeters to 10 nanometers (i.e. Infrared, visible, and ultraviolet light). The sensors would in this embodiment of course be coupled with light emitting diodes which emit electromagnetic radiation of the appropriate wavelength.

For example, in one embodiment infrared emitters coupled with infrared sensors (e.g. at 940 nm) may be used. The infrared sensor may be chosen with a bandwidth low enough to reject the visible light coming from the lighting LEDs of the lighting device. This is to ensure that the dirt measurements remain independent of the lighting LEDs output, which can vary over time in unpredictable ways due to varying luminosity settings as set by the network host computer, as well as due to the LED Usage Time Equalization mechanism which constantly varies the activation of LED groups.

Turning back to FIG. 5, which shows the dirt detection system being called upon and providing a dust masking factor Fd to be measured. If the dust masking factor Fd is under a preset number (in this case 75%) the status indicator 110 (see FIG. 4), is set to CLEANING NEEDED mode.

After the luminosity measuring system and the dirt detection means are finished the calculation means is activated to calculate the number of groups which are required to provide sufficient light based on the set luminosity, and the amount of LED degradation, and the dirt on the transparent face.

The formula used for this calculation is X=(Nstart*I)/(FI*Fd). In the formula X is the number of groups required to provide the luminosity which is desired. Nstart is the total number of LED groups used at the start of the lighting device's life-cycle. I is the luminosity setting of the lighting device, with 0 being no light and 1 being maximum lighting. FI is the LED degradation factor, with 1 being no degradation and lower values indicating LED degradation. E.g. a value of 0.5 would indicate that the LEDs are only giving off half of their original luminosity. Finally, Fd is the percentage of light going through the lighting device's transparent face, with 1 being full transmissivity and lower values indicating light lost due to dirt. E.g. a value of 0.5 would indicate that only half of the light is going through the transparent face of the lighting device.

After the calculation means calculated X, the partitioning means is activated (194, 196). The partitioning means sorts all the LED groups by usage time, and then selects the X groups with the least amount of usage time. These X groups with the least amount of usage time are then assigned to a first energized groups, while the remaining LED groups are assigned to a second non-energized group. The energizing means is then called on to energize the members of said first energized group and to de-energize the members of said second non-energized group.

Figure 8:
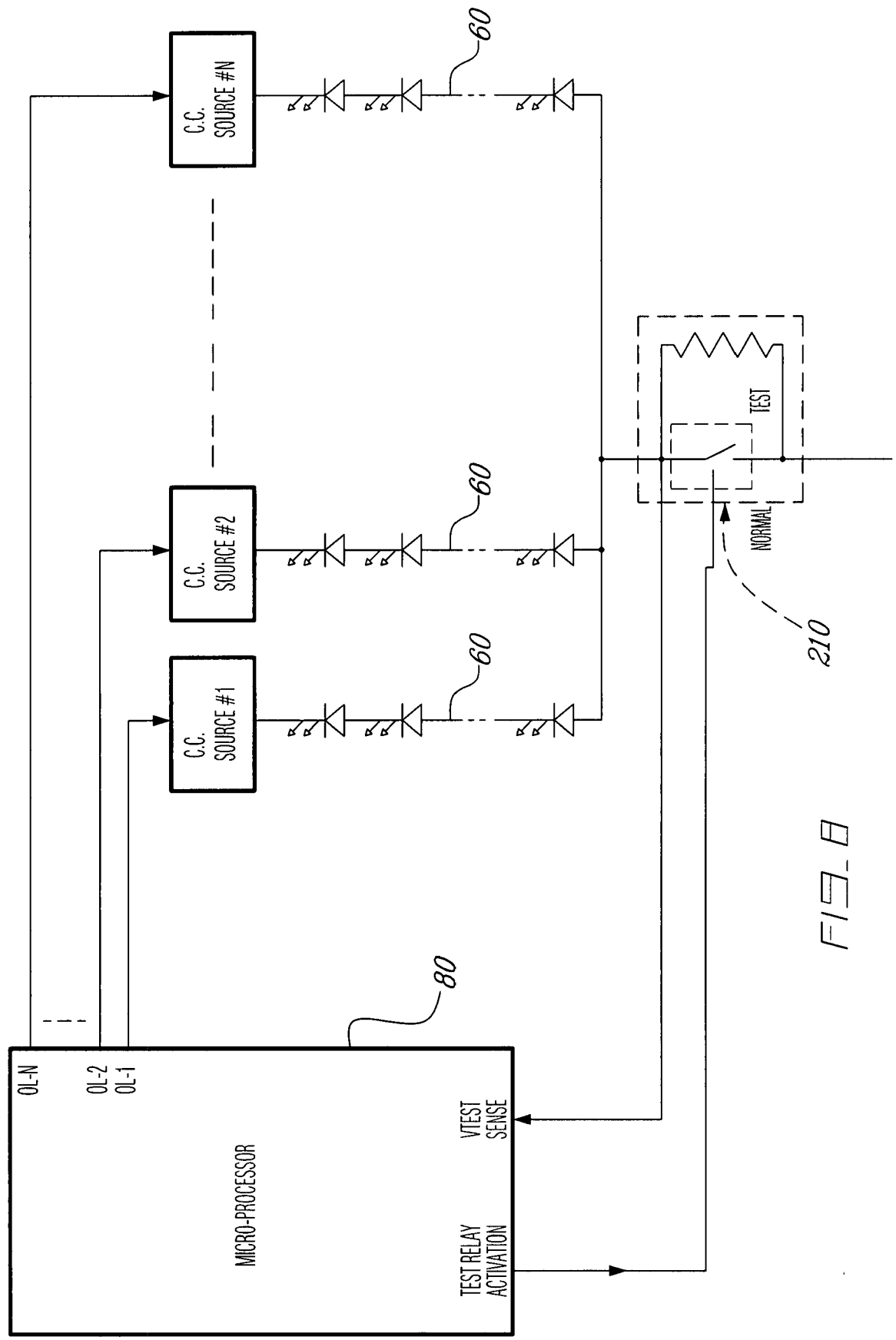
FIG. 8 shows a diagram of one example embodiment of a LED status monitoring system for use with the lighting device of the invention.

FIGS. 8 and 9 show in more detail the LEDs status monitoring system 90. The system 90 monitor on-demand the LEDs integrity by measuring whether any LEDs groups are open-circuited. A simple way to achieve this function is shown in FIG. 8, and functions by the following process:

Turn Off all LED groups.

At the common supply point of all LED groups, install in series with the supply line a test optocoupler 210.

Turn On one LEDs group; if it functions normally, the current it draws will turn On the test optocoupler 210. If one or more LED in the group is open-circuited, the group will draw no current and therefore the test optocoupler will remain Off. The test optocoupler output is monitored by a microprocessor input.

Successively turn On each of the LEDs groups in the LEDs Array and monitor them.

Once the test is finished, remove the test optocoupler from the supply line and resume normal operation.

Another way of accomplishing the LED status monitoring system is by continuous monitoring. In this version, shown in FIG. 9, the system is accomplished by adding current sensing inputs 220 on each LED groups, and multiplexing them to the lighting device's microprocessor. This method allows for monitoring the LED groups=status without interrupting the lighting device's normal operation, at the cost of substantially more circuitry.

Testing Procedure Activation

The LED status monitoring system with the first method requires an interruption of the lighting device's normal operation. During the measuring process, all groups are turned Off and each is then turned On one by one while its current is measured by the lighting device's microprocessor; open groups will report zero current. The time required to perform the measurement will typically be around 10 ms per LED group; therefore for a typical lighting device with 78 LED groups the complete testing procedure will take around 1s.

Because this testing procedure will be visible from outside (the lighting device will stop functioning normally during a second or so, and display a moving light pattern as each LED group is activated one by one), it cannot be performed too often. It will typically be performed once per 24 hours.

The testing procedure can be triggered in two ways:
1. The lighting device's microprocessor can perform the testing procedure on its own, through a built-in timer with a programmable period. Each lighting device contain a timer counter, automatically synchronized to the same time-of-day by the network host computer so that all lighting devices in the network have a synchronized time base.
2. Upon receiving a specific command from the network host computer.

In both cases, it is preferable to stagger the testing procedure for each lighting device in the network, so that normal operation is interrupted for only one (or a few) lighting device(s) at a time. In this way all lighting devices in the network can eventually be monitored without compromising the lighting level provided by the whole system.

The status indicator 110 as seen in FIG. 4, is a light which is visible from the outside of the casing 2. Under control of the microprocessor, the status indicator 110 will provide the following information about the current state of the lighting device:

| Indicator State | Status | Description |
| --- | --- | --- |
| Off | Normal | Normal operation |
| Slow Flashing | Cleaning Needed | The transparent face of the lighting device has accumulated an excess of dirt |
| Fast Flashing | No Communication | The communication link with the Host PC is lost |
| On | End of Life | The lighting device can no longer provide its specified luminosity, due to LED failure or degradation. |

"Cleaning Needed" Status:

The lighting device's built-in dirt detection sensor has determined that dirt accumulation on the face plate has decreased luminous intensity by a factor greater than a predetermined threshold value (typically 25%). To make this status clearly visible for a service team on the ground, the Status indicator is flashed at a slow rate.

"No Communication" Status:

The lighting device expects to receive commands at regular interval from the network Host PC (typically a few minutes). When this time-out interval (as measured by the lighting device's built-in timer) is exceeded, the lighting device detects the absence of communication and reverts to a "default" condition. This Default condition can include the following properties:
  1. Fast Flashing of Status Indicator
  2. Going to full intensity, to ensure that the worst-case lighting needs are fulfilled.

"End of Life" Status:

As the lighting device ages and the luminosity of its LEDs decreases, more and more LED groups are turned On to maintain a constant total luminosity. Eventually all available LED groups are required to achieve the full-intensity state. From that time onwards, the lighting device full-intensity luminosity will gradually decrease. To indicate this "End of Life" status, the Status Indicator is turned On by the lighting device's microprocessor.

This event can be accelerated if some LED groups actually fail (become open-circuited), as detected by the LED status monitoring system, since the pool of available LED groups is correspondingly reduced.

Note that at this "End of Life" point the lighting device is still operational, and may maintain a sizable proportion of its full-intensity luminosity for more years. Also, lower luminosity states (as selected by the network Host PC, for example during night time) can still be completely within specifications, as they may require fewer LED groups than the total available.

In one embodiment of the invention lane use signals may be included in the lighting device. In this embodiment each lighting device will incorporate a set of diodes (besides the ones being used for lighting purposes) which will serve as lane use signals in order to inform motorists on current road conditions. A red X will indicate that the lane is closed. Furthermore, one or many other signals can be incorporated according to prevailing circumstances (see FIG. 18). A green arrow will indicate that the lane is open, and if motorists have to be instructed to change lane (left or right), a yellow arrow pointing in the appropriate direction can be displayed. These signals can have a continuous or flashing display and will be controlled by the operator. A command is sent by the system operator from the host computer connected by the network connection means to each lighting device or lighting devices controller.

When a lane use signal is being displayed, the operator can send another command from the host computer through the network, to reduce the selected lighting device's brightness to the desired level, in order to enhance contrast for better visual impact of the signal. This command function is most often used in conjunction with the lane closed signal (the red cross). This is because, since the lane is closed then it requires less lighting. A moderate level such as for instance 50% of the lighting device's nighttime setting (e.g. 1.25 cd/m5) will usually be sufficient to provide adequate lighting.

A detection and protection mechanism will prevent displaying more than one signal concurrently on the same lighting device in order to avoid confusion and potentially dangerous situation or motorists. The detection and protection mechanism will work in conjunction with the LED status monitoring system 90, and the microprocessor 80 as seen in FIG. 4. The LED status monitoring system will be connected to the signal LEDs and to the microprocessor such that the LED status monitoring system monitors the signal LEDs and reports to the microprocessor. The microprocessor contains means for receiving the status of the signal LEDs from the LED status monitoring system and checking whether conflicting signals are being displayed.

An appropriate communication mechanism will return information to the system operator concerning the current status of the signals being displayed on the network's lighting devices.

For instance the appropriate information can be appended to the lighting device status report which the host computer will periodically request from each lighting device. The host computer can then receive the information and interpret it as necessary.

One useful part of the lighting device of the invention is the linking of a number of lighting devices to a network 130, and their control by the host computer through this network. This systems-level aspect of the invention brings a number of further capabilities and features.

Any communication network allowing multidrop connection of a large number of lighting devices to the host computer is suitable. As an example, the following protocols can be used: RS-485, Ethernet, TCP/IP.

FIGS. 10 and 11 show example networks of lighting devices. FIG. 10 shows an example network topology with only a few lighting devices for instance less than 128 devices. FIG. 11 on the other hand shows a larger network with a large number of lighting devices, for instance greater than 128 devices. In this network topology the lighting devices are grouped into individual nodes of less than 128, and node controllers 235 are included to relay information between the host computer and the lighting devices.

Each lighting device 1 on the network will be assigned and individual, unique address. The system is designed so that the host computer keeps a record of the physical location of each lighting device, referenced by its network address.

The address of each lighting device is stored in non-volatile memory within its electronic circuit. The lighting device is equipped with an address setting switch, accessible from the outside of the case, for instance physically or through remote controlling means such as infrared, laser or Radio Frequency signals. At system installation, this switch is activated to signal to the Host PC that the lighting device is requesting a network address, which is then generated and assigned automatically to the lighting device by the host computer.

The network linking of a number of lighting devices with a host computer has the following advantages:
1) Using the Host-to-lighting device communication direction allows the host computer to control important global aspects of the lighting system, such as the lighting intensity in specific zones of the system as a function of the time-of-day and/or ambient illumination, gradual dimming of lighting intensity in intensity level transitions, and activation of special functions such as integrated lane use signals.
2) Using the lighting device-to-Host communication direction allows the transfer of lighting devices status information to the host computer These elements are now described in greater details:

One of the functions of the host computer can control the overall or Global Intensity level of a lighting area. An example of this is shown in FIG. 12, which shows the lighting area (in this case a tunnel) being divided into three zones: A threshold zone 242, a transition zone 244, and an interior zone 246.

Because it has individual control over each lighting device, the host computer can vary the intensity level for each specific zone of the lighting area. For example, in a typical tunnel the daytime illumination in the threshold zone 242 will be set at 200 cd/m$^2$ the inner zone 246 at 5 cd/m$^2$, and the transition zone 244 at intermediate intensities.

The number, size and location of the lighting zones can be easily and arbitrarily modified through the Host software.

Another example of variation controlled by the host computer is the intensity level according to the time of day, and/or the ambient illumination.

According to standard requirements specified by the Illumination Engineers Society of North America in their document RP22-96 illumination in the interior a tunnel should be at least 5 cd/m$^2$ in the daytime and 2.5 cd/m$^2$ in the nighttime. As the lighting requirements for nighttime are substantially smaller than those of daytime, the system can reduce energy consumption by lowering the intensity during the nighttime.

To achieve this task the host computer can be equipped with a ambient illumination sensor at the entrances to the tunnel. The host computer would then use these sensors to detect ambient illumination. The ambient illumination measurement could then be used to adjust the light of the tunnel. Typical recommendations call for maintaining the threshold area illumination at least at $\frac{1}{10}$th the level of the ambient illumination during daytime.

When changing from one Intensity level to another, the Host can generate gradual Intensity transitions in order to maximize energy efficiency.

For example, when changing from Night to Day luminance levels, a discrete control system would have to select the Day level as soon as morning ambient light starts to grow. Instead, the host computer can perform a gradual ramping between Night and Day levels, thereby delaying the increased energy consumption of the day level and enhancing drivers' visual comfort. The ramping can be triggered when the ambient illumination reaches a predetermined level (typically 100 cd/m$^2$) and last for a user-adjusted length of time (typically 30 minutes).

Another important function of the host computer is monitoring lighting device status. At certain intervals the host computer will poll each lighting device on the network, to obtain its current status information.

This information can be tabulated and logged; alarms can be triggered if any potential failure or degradation is detected; and maintenance reports can be generated, listing the location and identification of each lighting device requiring servicing.

To prevent the loss of tunnel illumination under any circumstance (short of power failure), each lighting device will automatically revert to its normal Intensity level whenever contact with the host computer is lost for a time interval longer than an adjustable Communication Time-Out period.

In case of power failure, the system can facilitate the generation of emergency lighting backed up by UPS (Uninterruptible Power Supply). The energy consumption can be reduced to a minimum, either by greatly dimming the lighting devices, or by dynamically alternating the lighting devices in the on state.

In order to reduce energy consumption, the host computer can detect the presence of vehicles in the lighting area (through standard Vehicle Presence Detectors), and dim the Intensity level when no vehicle is present. This dimming can be further refined on a zone-by-zone basis as the vehicle moves across the lighting area.

Turning to FIG. 13, which shows the logic of the host computer. After initialization 250, the host computer enters a cycle in which it first checks the ambient light intensity and sets the lighting devices accordingly (252, 254, 256, 258). Afterwards the intensity setting of the lighting devices may be manually overridden (260, 262) if desired by a controller of the system. After the intensity of the lighting devices has been set the host computer proceeds to check the status of each lighting device in the network logging their status or flagging the lighting device as defective if the lighting device fails to respond (264, 266, 268, 270, 272). After each lighting device has been checked the host computer evaluates the network to see if sufficient light is being provided in the lighting area. If the luminosity if below standard of below a critical level an appropriate message will be displayed to the controller of the system.

| Summary of the advantages of the invention. | |
| --- | --- |
| Feature | Explanation |
| Better light efficiency | LEDs are inherently more efficient than current HID luminaries; Optical systems further improves the system. |
| Better light uniformity | Lighting device optical system optimized lighting pattern. Since light uniformity is greater, lower overall lighting levels can be used. |
| Tight intensity regulation and tolerance | Lighting device luminosity is known and stable throughout its life-cycle, allowing lower overall energy dissipation. |
| Proportional dimming | Allows the use of the optimal intensity required at each moment/location. |
| Vehicle presence detection | Allows dimming when no vehicle present. |

| Cost saving features. | |
| --- | --- |
| Feature | Explanation |
| Reduced usage cost: | |
| Competitive initial cost | Initial cost equivalent to current HID lighting devices |

-continued

Cost saving features.

| Feature | Explanation |
| --- | --- |
| Lower energy costs | Higher energy efficiency to current usage optimization |
| Longer life-cycle | LED lighting device life-cycle estimated at 15 years |
| Reduced maintenance cost: | |
| Precise status monitoring through host | Precludes the need of regular inspections |
| Low voltage operation | Allows the use of non-electricians for maintenance |
| Fast on-site identification of defective lamps | Through Status Indicator |

The invention claimed is:

1. An illumination lighting device comprising
a plurality of illumination groups, each of said illumination groups containing one or more light emitting diodes and being configured for passing between an energized light emitting state and a non-energized state, and
control means for maintaining the luminosity of the lighting device at a desired level, said luminosity being controlled by, at predetermined time intervals, transferring an appropriate number of illumination groups between said energized light emitting state and said non-energized state,
whereby
said transfer is effected in response to a luminosity reading and/or a usage time measurement, and
said lighting device comprises at least one of usage time measuring means for providing a usage time measurement for each of said illumination groups at predetermined time intervals, and
a luminosity measuring system comprising
  i) luminosity measuring means,
  ii) one or more test light emitting diodes equivalent to the light emitting diodes of said plurality of illumination groups,
said luminosity measuring means being able to provide said luminosity reading at predetermined time intervals, on the basis of the light of said one or more test light emitting diodes when said one or more test light emitting diodes are in an energized state, wherein said one or more test light emitting diodes are selected from among light emitting diodes which are part of said illumination groups and which are separate from said illumination groups.

2. A lighting device as claimed in claim 1 wherein said controller means further comprises:
means for detecting whether any of said illumination groups of light emitting diodes have a light emitting diode unable to pass between said energized light emitting state and said non-energized state, and for transferring a so detected group to a nonfunctional state.

3. A lighting device as claimed in claim 2 wherein each of said illumination groups of light emitting diodes contains a plurality of light emitting diodes.

4. A lighting device as claimed in claim 2 wherein for the energization of light emitting diodes, said device comprises constant current source means.

5. A lighting device as claimed in claim 2 wherein said lighting device is a single device.

6. A lighting device as defined in claim 1, wherein said lighting device comprises said luminosity measuring system and wherein said lighting device further comprises said usage time measuring means.

7. A lighting device as defined in claim 6, wherein said test light emitting diodes are selected from light emitting diodes which are separate from the light emitting diodes of said illumination groups.

8. A lighting device as claimed in claim 6, wherein said usage time measurement is a cumulative usage time measurement for each of said illumination groups of light emitting diodes.

9. A lighting device as claimed in claim 8, wherein said controller means is configured to equalize the cumulative usage time for each of said illumination groups of light emitting diodes by prioritizing illumination groups of light emitting diodes having the lowest said cumulative usage time for transfer to said energized light emitting state.

10. A lighting device as defined in claim 8, wherein said test light emitting diodes are selected from light emitting diodes which are members of said illumination groups.

11. A lighting device as defined in claim 8, wherein said test light emitting diodes are selected from light emitting diodes which are separate from the light emitting diodes of said illumination groups.

12. A lighting device as claimed in claim 1 wherein each of said illumination groups of light emitting diodes contains a plurality of light emitting diodes.

13. A lighting device as claimed in claim 6 wherein each of said illumination groups of light emitting diodes contains a plurality of light emitting diodes.

14. A lighting device as defined in claim 1, wherein said lighting device comprises said luminosity measuring system.

15. A lighting device as defined in claim 1, wherein said test light emitting diodes are selected from light emitting diodes which are members of said illumination groups.

16. A lighting device as defined in claim 1, wherein said test light emitting diodes are selected from light emitting diodes which are separate from the light emitting diodes of said illumination groups.

17. A lighting device as defined in claim 1, wherein said lighting device comprises said usage time measuring means.

18. A lighting device as claimed in claim 1, wherein said usage time measurement is a cumulative usage time measurement for each of said illumination groups of light emitting diodes.

19. A lighting device as claimed in claim 18, wherein said controller means is configured to equalize the cumulative usage time for each of said illumination groups of light emitting diodes by prioritizing illumination groups of light emitting diodes having the lowest said cumulative usage time for transfer to said energized light emitting state.

20. A lighting device as claimed in claim 1 wherein for the energization of light emitting diodes, said device comprises constant current source means.

21. A lighting device as claimed in claim 1 wherein said lighting device is a single device.

22. A lighting device comprising
a plurality of groups of light emitting diodes, each of said groups of light emitting diodes containing one or more light emitting diodes, each of said light emitting diodes being configured so as to pass between an energized light emitting state and a non-energized state;
luminosity measuring means for providing a standard luminosity reading at predetermined time intervals;
controller means for transferring, at predetermined time intervals, in response to said standard luminosity reading, one or more of said groups of light emitting diodes between a first energized group wherein said light emitting diodes are in said energized light emitting state and a second non-energized group wherein said light emitting diodes are in said non-energized state and wherein said controller means further comprises:

means for detecting whether any of said groups of light emitting diodes have a light emitting diode unable to pass between said energized light emitting state and said non-energized state, and for transferring a so detected group to a non-functional state.

23. A lighting device as claimed in claim 22 wherein each of said groups of light emitting diodes contains a plurality of light emitting diodes.

24. A lighting device as claimed in claim 22 wherein for the energization of light emitting diodes, said device comprises constant current source means.

25. A lighting device as claimed in claim 22 wherein said lighting device is a single device.

26. A lighting device comprising a plurality of groups of light emitting diodes, each of said groups of light emitting diodes containing one or more light emitting diodes, each of said light emitting diodes being configured so as to pass between an energized light emitting state and a non-energized state;

usage time measuring means for providing a usage time measurement for each of said groups of light emitting diodes at predetermined intervals;

controller means for transferring, at predetermined time intervals, in response to said usage time measurements, one or more of said groups of light emitting diodes between a first energized group wherein said light emitting diodes are in said energized light emitting state and a second non-energized group wherein said light emitting diodes are in said non-energized state and wherein said controller means further comprises:

means for detecting whether any of said groups of light emitting diodes have a light emitting diode unable to pass between said energized light emitting state and said non-energized state, and for transferring a so detected group to a non-functional state.

27. A lighting device as claimed in claim 26 wherein each of said groups of light emitting diodes contains a plurality of light emitting diodes.

28. A lighting device as claimed in claim 26 wherein for the energization of light emitting diodes, said device comprises constant current source means.

29. A lighting device as claimed in claim 26 wherein said lighting device is a single device.

* * * * *